(12) United States Patent
Beh et al.

(10) Patent No.: US 7,158,442 B1
(45) Date of Patent: Jan. 2, 2007

(54) FLEXIBLE LATENCY IN FLASH MEMORY

(75) Inventors: Jih Hong Beh, Sunnyvale, CA (US); Ken Cheong Cheah, Penang (MY)

(73) Assignee: Spansion LLC, Sunnyvale, CA (US)

( * ) Notice: Subject to any disclaimer, the term of this patent is extended or adjusted under 35 U.S.C. 154(b) by 54 days.

(21) Appl. No.: 11/135,231

(22) Filed: May 23, 2005

(51) Int. Cl.
*G11C 8/00* (2006.01)

(52) U.S. Cl. .................. 365/233; 365/221; 365/189.05; 365/189.01

(58) Field of Classification Search ................ 365/233, 365/221, 189.05, 189.01
See application file for complete search history.

(56) References Cited

U.S. PATENT DOCUMENTS

| | | | | |
|---|---|---|---|---|
| 6,038,169 A | * | 3/2000 | Ogura et al. ........... | 365/185.11 |
| 7,042,795 B1 | * | 5/2006 | Lee et al. .............. | 365/230.06 |

* cited by examiner

Primary Examiner—Richard Elms
Assistant Examiner—N Nguyen

(57) ABSTRACT

A method of reading data in and outputting data from a memory structure includes a buffer. In the present method, first read operation is undertaken to read a first set of data in the memory structure and provide data of the first set of data to the buffer, using an output clock. A first output operation is undertaken providing data read in the first read operation from the buffer, and a second read operation is undertaken to read a second set of data in the memory structure and provide data of the second set of data to the buffer, using the output clock. A second output operation is undertaken providing data read in the second read operation from the buffer. In the event that the completion of the first output operation would occur prior to the completion of the provision of the data of the second set of data to the buffer, a flexible time delay approach is undertaken so that, between the completion of the first output operation and the beginning of the second output operation, the minimum number of latencies are added as needed to insure that the provision of the data of the second set of data to the buffer is completed prior to the initiation of the second output operation.

15 Claims, 36 Drawing Sheets

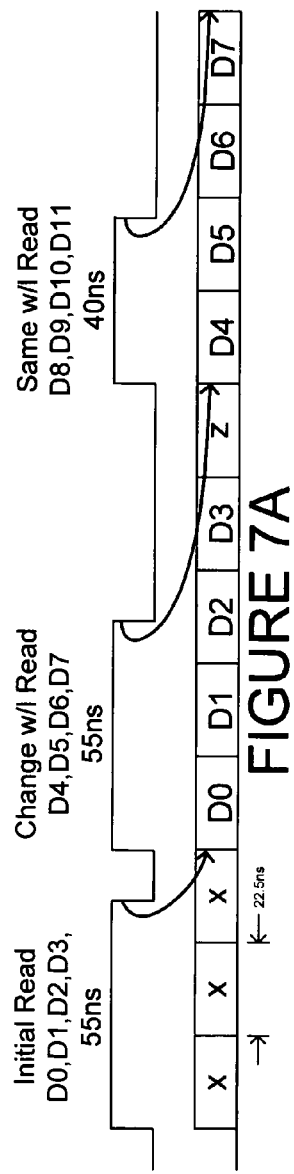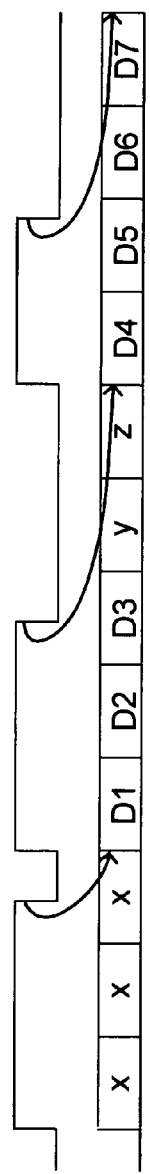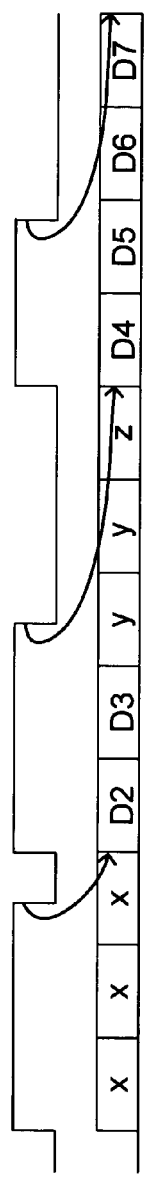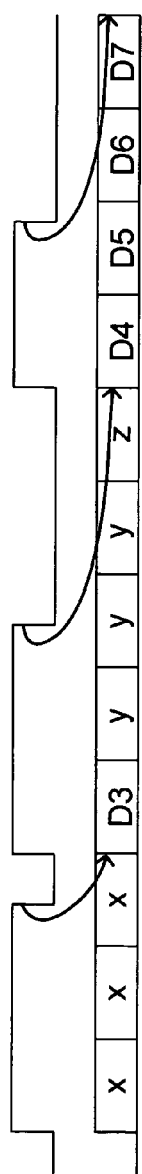
FIGURE 7A
FIGURE 7B
FIGURE 7C
FIGURE 7D
FIGURE 7 (PRIOR ART)

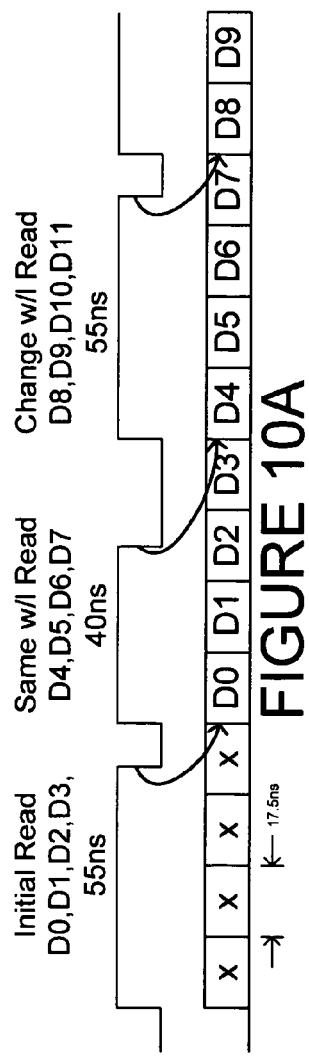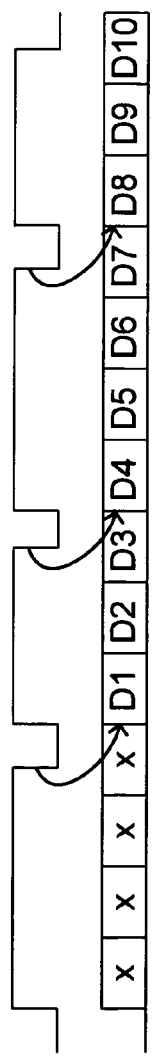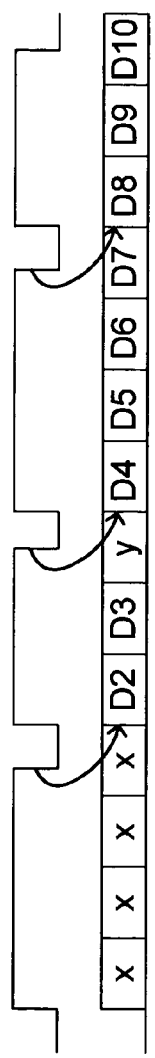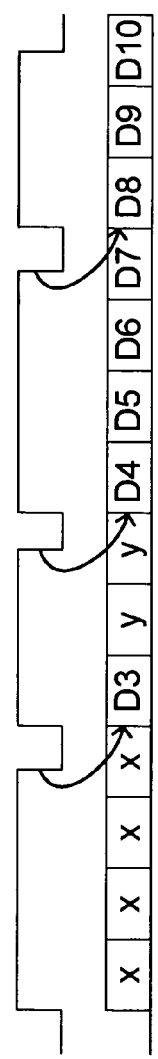
FIGURE 10A
FIGURE 10B
FIGURE 10C
FIGURE 10D
FIGURE 10

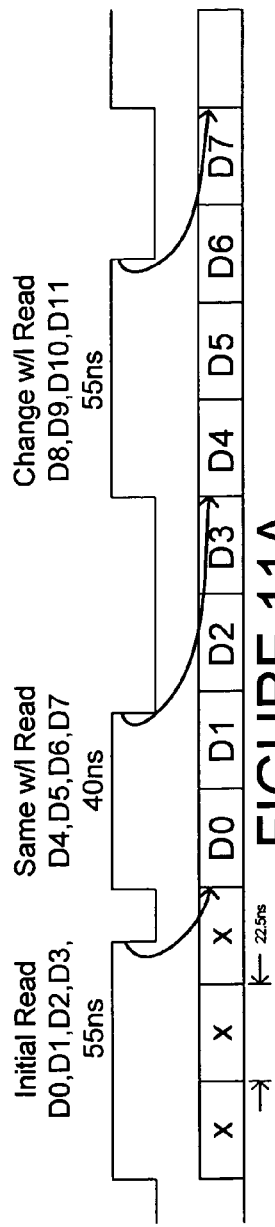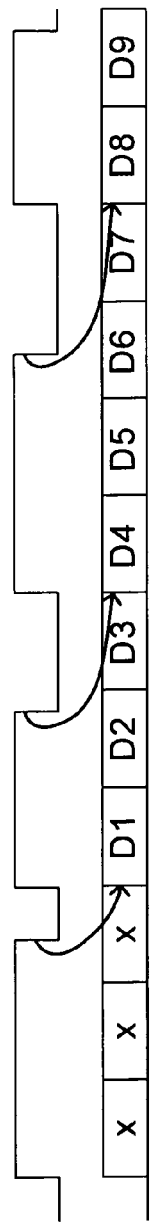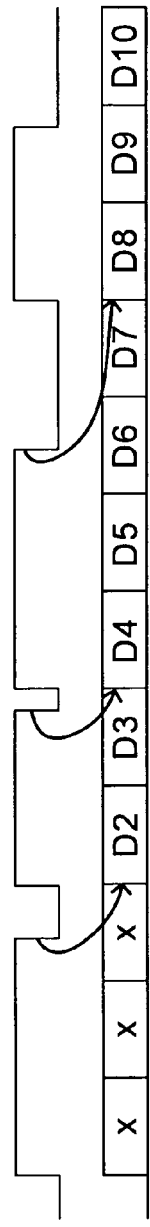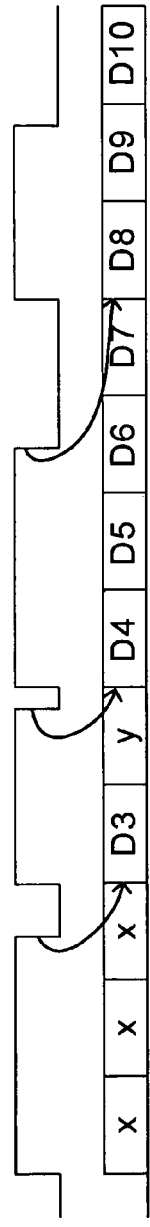
FIGURE 11A
FIGURE 11B
FIGURE 11C
FIGURE 11D
FIGURE 11

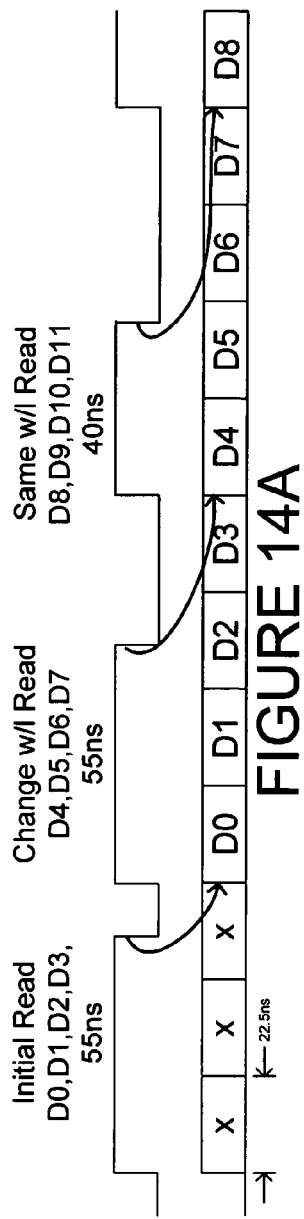
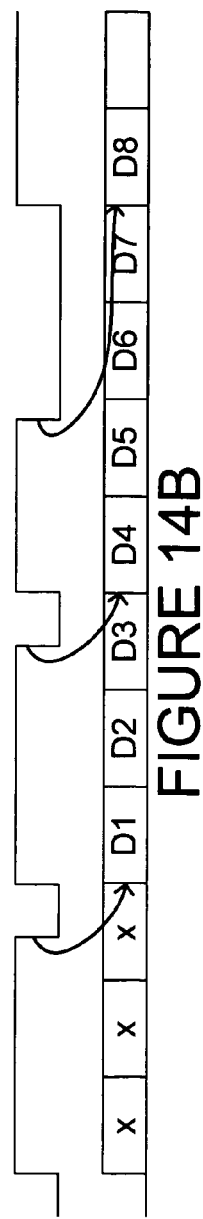
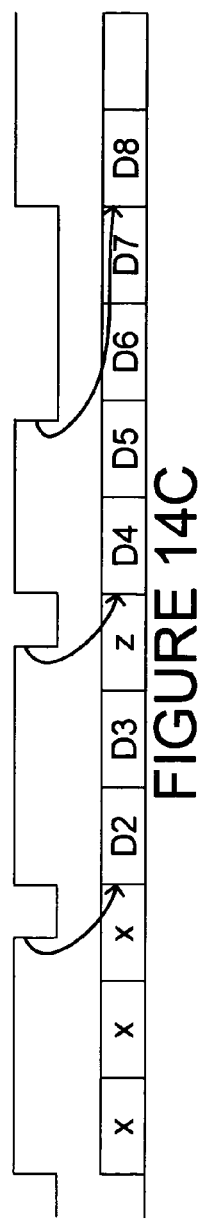
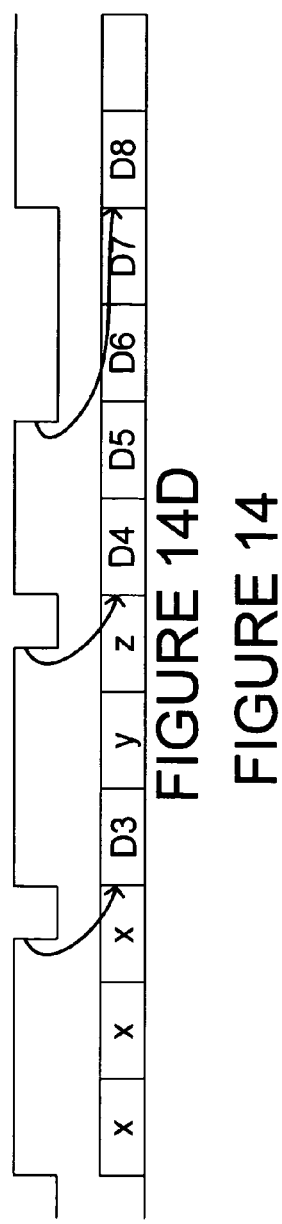
FIGURE 14A
FIGURE 14B
FIGURE 14C
FIGURE 14D
FIGURE 14

| FIGURE 22A | FIGURE 23A | FIGURE 24A | FIGURE 25A |
| FIGURE 22B | FIGURE 23B | FIGURE 24B | FIGURE 25B |

FIGURE 22　　FIGURE 23　　FIGURE 24　　FIGURE 25

| FIGURE 26A | FIGURE 27A | FIGURE 28A | FIGURE 29A |
| FIGURE 26B | FIGURE 27B | FIGURE 28B | FIGURE 29B |

FIGURE 26　　FIGURE 27　　FIGURE 28　　FIGURE 29

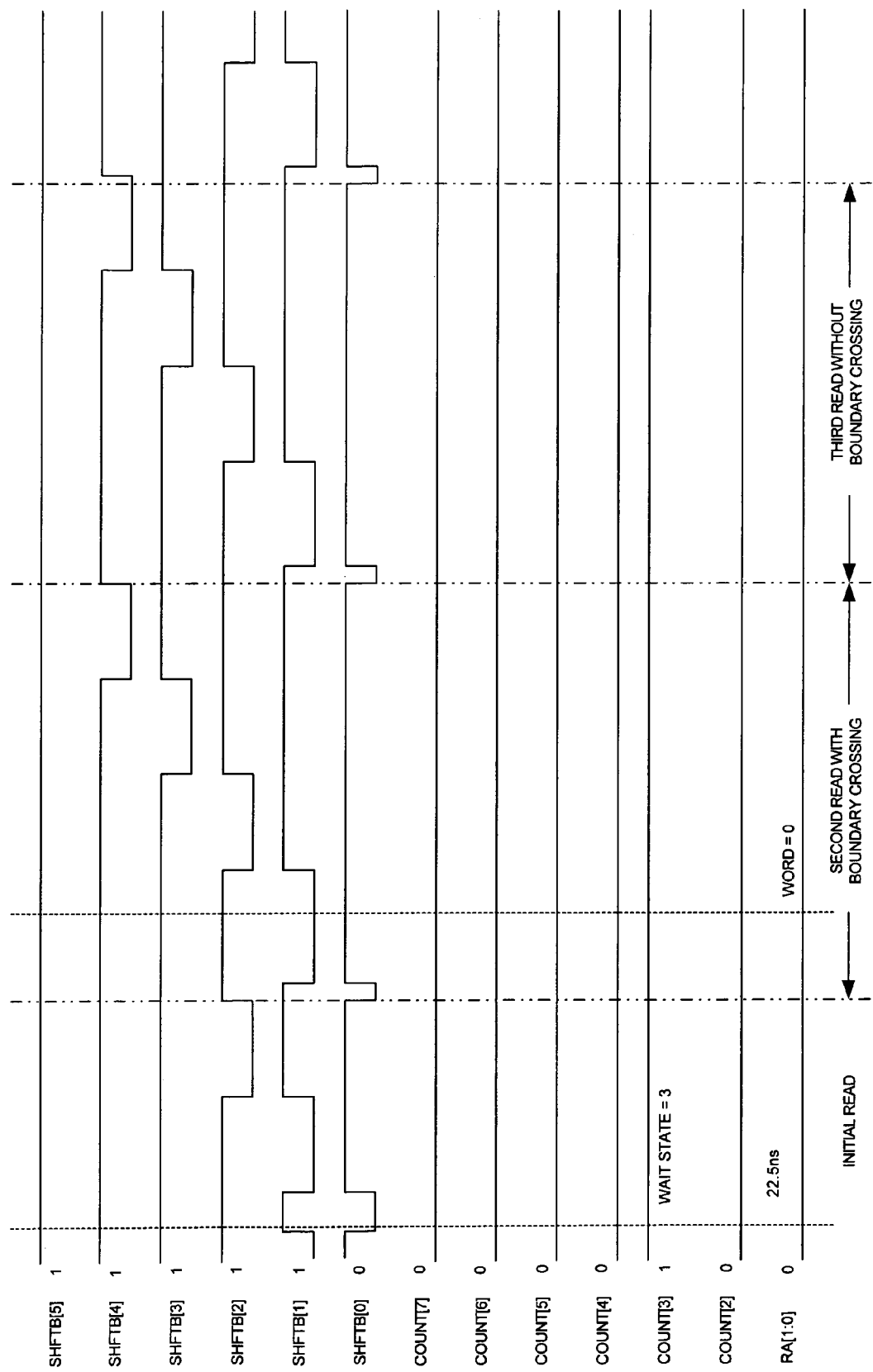

FLEXIBLE LATENCY IN FLASH MEMORY

BACKGROUND OF THE INVENTION

1. Technical Field

This invention relates generally to memory devices, and more particularly, to burst-type flash memory.

2. Background Art

FIG. 1 illustrates a memory structure 50 which includes a flash memory 52 and a buffer 54. The operation of the memory structure 50 is described with reference to the timing diagrams of FIGS. 2–7. In general, a read operation is undertaken to read data in the memory 52 and provide such data to the buffer 54. The data provided to the buffer 54 is then clocked out, as an output from the memory structure 50. Successive memory read operations provide successive data sets to the buffer 54, which are successively clocked out as outputs from the memory structure 50.

With regard to the following discussion, it will be understood that speeds may vary based on the technology and architecture of the design. The following are illustrative examples.

With reference to FIG. 2A, an initial or first read signal accesses and reads a data set of four data words D0, D1, D2, D3 in the memory 52, and loads those data words D0, D1, D2, D3 in the buffer 54. This data set is loaded in the buffer 54 in 55 ns, which is the time needed to boost a word line associated with the accessing of this data set (15 ns), and to sense and load the four data words D0, D1, D2, D3 into the buffer 54 (40 ns). Meanwhile, in this example, an output clock is running at a frequency of, for example, 80 MHz. In order to undertake an output operation of the data words D0, D1, D2, D3, all such data words D0, D1, D2, D3 must be in the buffer 54, i.e., the read operation of those data words must be completed prior to undertaking an output operation thereof. In furtherance thereof, a series of successive initial time delays (x) of the output operation are included, dependent on the clock frequency, each time delay (x) being equal to a single clock cycle of the output clock, in this embodiment, 12.5 ns. Thus, in this example, the number of time delays (x) provided is five (x+x+x+x+x), and each time delay (x)=12.5 ns for a total of 62.5 ns delay from the initiation of the read operation, which time of 62.5 exceeds the read time operation of 55 ns, to ensure that all data words D0, D1, D2, D3 are in the buffer 54 prior to an output thereof (FIG. 2A).

After and upon completion of this period of 62.5 ns, data in the buffer 54 is clocked out as an output from the memory structure 50, with each data word clocked out in one clock cycle, i.e., one data word per 12.5 ns. In this example, in the first output operation, the four data words D0, D1, D2, D3 are successively clocked out, so that the overall output operation takes 50 ns (as will be further noted, the user may elect to start the output operation with data word D1, data word D2, or data word D3). Meanwhile, starting at the initiation of the output operation of the data words D0, D1, D2, D3, a second read operation is undertaken, in this example using the same word line as in accessing the first data set. Since this word line is already boosted, the 15 ns period for boosting a word line is not required, and complete reading of the next set of data made up of data words D4, D5, D6, D7 requires 40 ns. The second read operation, initiated at the same time as the start of the output operation of data words D0, D1, D2, D3, is completed prior to the completion of the output operation of data words D0, D1, D2, D3 (40 ns v. 50 ns), and thus all data words D4, D5, D6, D7 are in the buffer 54 in time for the initiation of output therefrom immediately upon completion of the output of the data words D0, D1, D2, D3.

In the second output operation, the four data words D4, D5, D6, D7 are then successively clocked out, so that overall the second output operation takes 50 ns. Meanwhile, starting at the initiation of the output of the data words D4, D5, D6, D7, a third read operation is undertaken, in this example using a different word line. A third read signal accesses and reads a data set of four data words D8, D9, D10, D11 in the memory 52, and loads those data words D8, D9, D10, D11 in the buffer 54. This data set is provided to the buffer 54 in 55 ns, which is the time taken to boost a new word line associated with the accessing of this data (11 ns, a word line boundary crossing condition), and to sense and load the four data words D8, D9, D10, D11 in the buffer 54 (40 ns). The third read operation (55 ns), initiated at the same time as the start of the output operation of the data words D4, D5, D6, D7, is not completed prior to the completion of this output operation (50 ns), and all data words D8, D9, D10, D11 are not in the buffer 54 at completion of the output of the data words D4, D5, D6, D7, i.e., the third read operation is not yet complete. In such situation, a time delay (z) is added to the output cycle at the completion of the output of the data words D4, D5, D6, D7, equal to a single clock cycle of the output clock, in this embodiment, 12.5 ns. With the output of the data words D4, D5, D6, D7 requiring 50 ns, and with the delay of (z)=12.5 ns added thereto (total of 62.5 ns), the output of data words D8, D9, D10, D11 will not begin until after completion of the read operation of data words D8, D9, D10, D11 (55 ns), ensuring that all data words D8, D9, D10, D11 are in the buffer 54 prior to initiation of output thereof from the buffer 54.

FIG. 2B illustrates a situation similar to the illustrated in FIG. 2A. However, where in FIG. 2A the output from the buffer 54 started with data word D0, the output from the buffer 54 in this example starts with data word D1. In the first output operation, only data words D1, D2, D3 are successively output, requiring 37.5 ns. The output operation of the data words D1, D2, D3 is completed prior to completion of the read operation of the data words D4, D5, D6, D7, and all data words D4, D5, D6, D7 are not loaded in the buffer 54 at completion of the output of the data words D1, D2, D3, i.e., the read operation of data words D4, D5, D6, D7 is not yet complete. In such situation, a time delay (y) is added to the output cycle at the completion of the output of the data words D1, D2, D3, equal to a single clock cycle of the output clock, in this embodiment, 12.5 ns. With the output of the data words D1, D2, D3 requiring 37.5 ns, and with the delay (y) of 12.5 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. It will be noted that the situation in regard to addition of the time delay (z) remains the same.

FIG. 2C illustrates a situation similar to those illustrated in FIGS. 2A and 2B. However, where in FIG. 2A the output from the buffer 54 started with data word D0, and in FIG. 2B the output from the buffer 54 started with data word D1, in this example the output from the buffer 54 starts with data word D2. In the first output operation, only data words D2, D3 are successively output, requiring 25 ns. The output operation of the data words D2, D3 is completed prior to completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not yet complete. In such situation, a time delay (y+y) is added to the output cycle at the completion of the output of the data words D2, D3, y being equal to a single clock cycle of the output clock, in this embodiment, 12.5 ns. With the output of the data words D2, D3 requiring 25 ns, and with the delay (y+y) of 25 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. It will be noted that the situation in regard to addition of the time delay (z) remains the same.

FIG. 2D illustrates a situation similar to those illustrated in FIGS. 2A, 2B and 2C. However, where in FIG. 2A the output from the buffer 54 started with data word D0, in FIG. 2C the output from the buffer 54 started with data word D1, and in FIG. 2B the output from the buffer 54 started with data word D2, in this example the output from the buffer 54 starts with data word D3. In the first output operation, only data word D3 is output, requiring 12.5 ns. The output operation of the data word D3 is completed prior to completion of the read operation of the data words D4, D5, D6, D7, and all data words D4, D5, D6, D7 are not loaded in the buffer 54 at completion of the output of the data word D3, i.e., the read operation of data words D4, D5, D6, D7 is not yet complete. In such situation, a time delay (y+y+y) is added to the output cycle at the completion of the output of the data word D3, (y) being equal to a single clock cycle of the output clock, in this embodiment, 12.5 ns. With the output of the data word D3 requiring 12.5 ns, and with the delay (y+y+y) of 37.5 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. Again, the situation in regard to addition of the time delay (z) remains the same.

In the typical design, the time delay characteristics described above are built into the system. That is, if it has been determined that initial output will take place with the data word D0, no time delay (y) is provided. On the other hand, if it has been determined that initial output will take place with the data word D1, a single time delay (y) will be provided as described above. Similarly, if it has been determined that initial output will take place with the data word D2, a time delay of (y+y) is provided as described above, and if it has been determined that initial output will take place with the data word D3, a time delay of (y+y+y) is provided as described above. Additionally, each time a different word line is used to access data, a time delay of (z) is provided as described above. The time delays are built in to account for an extreme case scenario as illustrated in FIGS. 2A–2D, in order to ensure that the read operation of a data set is completed prior to an attempt to output that data set. However, in designing for such a scenario, these built-in time delays result in an overall slowdown in the output of data in situations where such time delays are not needed, as will now be described.

In the example of FIG. 3A, similar to the example of FIG. 2A, an initial or first read signal accesses and reads a data set of four data words D0, D1, D2, D3 in the memory 52, and loads those data words D0, D1, D2, D3 in the buffer 54. This data set is loaded in the buffer 54 in 55 ns, which is the time needed to boost a word line associated with the accessing of this data set (15 ns), and to sense and load the four data words D0, D1, D2, D3 in the buffer 54 (40 ns). Meanwhile, in this example, an output clock is running at a frequency of 57 MHz, slower than in the previous example. In order to undertake an output operation of the data words D0, D1, D2, D3, all such data words D0, D1, D2, D3 must be in the buffer 54, i.e., the read operation of those data words must be completed prior to undertaking an output operation thereof. In furtherance thereof, a series of successive initial time delays (x) of the output operation are included, each time delay (x) being equal to a single clock cycle of the output clock, in this embodiment, 17.5 ns. Thus, in this example, the number of time delays (x) provided is four (x+x+x+x), and each time delay (x)=17.5 ns for a total of 70 ns delay from the initiation of the read operation, which time of 70 ns exceeds the read time operation of 55 ns, to ensure that all data words D0, D1, D2, D3 are in the buffer 54 prior to an output thereof (FIG. 3A).

After and upon completion of this period of 70 ns, data in the buffer 54 is clocked out as an output from the memory structure, with each data word clocked out in one clock cycle, i.e., one data word per 17.5 ns. In this example, in the first output operation, the four data words D0, D1, D2, D3 are successively clocked out, so that the overall output operation takes 70 ns. Meanwhile, starting at the initiation of the output operation of the data words D0, D1, D2, D3, a second read operation is undertaken, in this example using the same word line as in accessing the first data set. Since this word line is already boosted, the 15 ns period for boosting a word line is not required, and complete reading of the next set of data made up of data words D4, D5, D6, D7 requires 40 ns. The second read operation, initiated at the same time as the start of the output operation of data words D0, D1, D2, D3, is completed prior to the completion of the output operation of data words D0, D1, D2, D3 (40 ns v. 70 ns), and thus all data words D4, D5, D6, D7 are in the buffer 54 in time for the initiation of output therefrom immediately upon completion of the output of the data words D0, D1, D2, D3.

In the second output operation, the four data words D4, D5, D6, D7 are then successively clocked out, so that overall the second output operation takes 70 ns. Meanwhile, starting at the initiation of the output of the data words D4, D5, D6, D7, a third read operation is undertaken, in this example using a different word line. A third read signal accesses and reads a data set of four data words D8, D9, D10, D11 in the memory 52, and loads those data words D8, D9, D10, D11 in the buffer 54. This data set is provided to the buffer 54 in 55 ns, which is the time taken to boost a new word line associated with the accessing of this data (15 ns), and to sense and load the four data words D8, D9, D10, D11 into the buffer 54 (40 ns). The third read operation (55 ns), initiated at the same time as the start of the output operation of the data words D4, D5, D6, D7, is completed prior to the completion of this output operation (70 ns), and all data words D8, D9, D10, D11 are in the buffer 54 at completion of the output of the data words D4, D5, D6, D7, i.e., the third read operation is complete. However, the time delay (z), built into the system, is added to the output cycle at the completion of the output of the data words D4, D5, D6, D7, equal to a single clock cycle of the output clock, in this embodiment, 17.5 ns. This time delay (z) is not needed in this situation, and results in slowing down the output operation, which, without this time delay (z), could continue with the output of data words D8, D9, D10, D11 immediately after completion of the output of the data words D4, D5, D6, D7.

FIG. 3B illustrates a situation similar to the illustrated in FIG. 3A. However, where in FIG. 3A the output from the buffer 54 started with data word D0, the output from the buffer 54 in this example starts with data word D1. In the first output operation, only data words D1, D2, D3 are successively output, requiring 52.5 ns. The output operation of the data words D1, D2, D3 is completed after completion of the read operation of the data words D4, D5, D6, D7 (40 ns), and all data words D4, D5, D6, D7 are loaded in the buffer 54 at completion of the output of the data words D1, D2, D3, i.e., the read operation of data words D4, D5, D6, D7 is complete. However, the time delay (y), built into the system, is added to the output cycle at the completion of the output of the data words D1, D2, D3, equal to a single clock cycle of the output clock, in this embodiment, 17.5 ns. This time delay (y) is not needed in this situation, and results in slowing down the output operation, which, without this time delay (y), could continue with the output of data words D4, D5, D6, D7 immediately after completion of the output of the data words D1, D2, D3. It will be noted that the situation in regard to addition of the time delay (z) remains the same, i.e., the time delay (z) built into the system is not needed.

FIG. 3C illustrates a situation similar to that illustrated in FIGS. 3A and 3B. However, where in FIG. 3A the output from the buffer 54 started with data word D0, and in FIG. 3B the output from the buffer 54 started with data word D1, the output in this example starts with data word D2. In the first output operation, only data words D2, D3 are successively output, requiring 35 ns. The output operation of the data words D2, D3 is completed before completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not complete. It will be noted that a single time delay (y)=17.5 ns (one output clock cycle) is needed after the output of data word D3 to insure loading of the data words D4, D5, D6, D7 in the buffer 54 prior to their being clocked out. However, the time delay (y+y), built into the system, is added to the output cycle at the completion of the output of the data words D2, D3, equal to two single clock cycles of the output clock, in this embodiment, 35 ns. Only one time delay (y) is needed in this situation, and the inclusion of built in time delay (y+y) results in slowing down the output operation, which, with only one time delay (y), could continue with the output of data words D4, D5, D6, D7 after only one time delay (y) after completion of the output of the data words D2, D3. It will be noted that the situation in regard to addition of the time delay (z) remains the same, i.e., the time delay (z) built into the system is not needed.

FIG. 3D illustrates a situation similar to that illustrated in FIGS. 3A, 3B and 3C. However, where in FIG. 3A the output from the buffer 54 started with data word D0, in FIG. 3B the output from the buffer 54 started with data word D1, and in FIG. 3C the output from the buffer 54 started with data word D2, the output in this example starts with data word D3. In the first output operation, only data word D3 is output, requiring 17.5 ns. The output operation of the data word D3 is completed before completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not complete. It will be noted that two time delays (y+y)=35 ns (two output clock cycles) are needed after the output of data word D3 to insure loading of the data words D4, D5, D6, D7 in the buffer 54 prior to their being clocked out. However, the time delay (y+y+y), built into the system, is added to the output cycle at the completion of the output of the data word D3, equal to three single clock cycles of the output clock, in this embodiment, 52.5 ns. Only two time delays (y+y) are needed in this situation, and the inclusion of built in time delay (y+y+y) results in slowing down the output operation, which, could continue with the output of data words D4, D5, D6, D7 with only two time delays (y+y) after completion of the output of the data words D3. It will be noted that the situation in regard to addition of the time delay (z) remains the same, i.e., the time delay (z) built into the system is not needed.

FIGS. 4A–4D are similar to FIGS. 3A–3D but illustrate an embodiment wherein the output clock runs at 44 MHz, so that data words are clocked out at 22.5 ns each. In this case, it will be seen that, similar to the embodiment of FIGS. 3A–3D, no delay (z) is needed. In addition, if the output from the buffer 54 is started with data word D0, D1 or D2, no delay (y) is needed, and if the output from the buffer 54 is started with data word D3, only a single delay (y) is needed.

FIG. 5 illustrates a timing diagram wherein the second read operation, unlike the previous timing diagrams, involves a change in word line from the first read operation, so that the second read operation takes 55 ns instead of 40 ns. The output frequency is provided as 80 MHz, so that each output cycle takes 12.5 ns. In FIG. 5A, with data output beginning at data word D0, a time delay (z) must be added at the completion of the output of the data words D0, D1, D2, D3, similar to the previous embodiment of FIG. 2A, to allow for the time of word line boost for the new word line. In FIG. 5B, with the output starting from data word D1, a time delay (y), in addition to time delay (z), must be added at the completion of the output of the data words D1, D2, D3. In FIG. 5C, with the output starting from data word D2, a time delay (y+y), in addition to time delay (z), must be added at the completion of the output of the data words D2, D3. In FIG. 5D, with the output starting from data word D3, a time delay (y+y+y), in addition to time delay (z), must be added at the completion of the output of the data word D3. Similar to the previous description, the time delays are built into the system to allow for this extreme case.

It will be seen that in accordance with the analysis, in the situation where the output clock is run at 57 MHz, so that each output cycle takes 17.5 ns, with data output beginning at data word D0 (FIG. 6A), no time delays are needed, with data output beginning at data word D1 (FIG. 6B), one time delay is needed, with data output beginning at data word D2 (FIG. 6C), two time delays are needed, and with data output beginning at data word D3 (FIG. 6D), three time delays are needed. With reference to FIG. 7, with the output clock running at 44 MHz and with each clock cycle taking 22.5 ns, with data output beginning at data word D0 (FIG. 7A) or D1 (FIG. 7B), no time delays are needed. With data output beginning at data word D2 (FIG. 7C), only one time delay is needed, and with data output beginning at data word D3 (FIG. 7D) only two time delays are needed.

As pointed out above, the built-in time delays result in an overall slowdown in the output of data in situations where output frequency is slow and such time delays are not needed. Therefore, what is needed is an approach in a memory system wherein delays of the type described above are optimized.

DISCLOSURE OF THE INVENTION

Broadly stated, presented herein is a method of reading data in and outputting data from a memory structure including a buffer. The method comprises undertaking a first read operation to read a first set of data in the memory structure and provide data of the first set of data to the buffer, using an output clock, undertaking a first output operation providing data read in the first read operation from the buffer, undertaking a second read operation to read a second set of data in the memory structure and provide data of the second set of data to the buffer, using the output clock, undertaking a second output operation providing data read in the second read operation from the buffer, and, in the event that the completion of the first output operation would occur prior to the completion of the provision of the data of the second set of data to the buffer, a flexible time delay approach is undertaken, so that between the completion of the first output operation and the beginning of the second output operation, the minimum number of latencies is added as needed to insure that the provision of the data of the second set of data to the buffer is completed prior to the initiation of the second output operation.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIGS. 7A–7D are timing diagrams illustrating the operation of the memory structure of FIG. 1 at the third output frequency for the second set of data operations in accordance with the prior art;

FIGS. 10A–10D are timing diagrams illustrating the operation of the memory structure of FIG. 1 at the second output frequency for the first set of data operations in accordance with the present invention;

FIGS. 11A–11D are timing diagrams illustrating the operation of the memory structure of FIG. 1 at the third output frequency for the first set of data operations in accordance with the present invention;

FIGS. 14A–14D are timing diagrams illustrating the operation of the memory structure of FIG. 1 at the third output frequency for the second set of data operations in accordance with the present invention.

FIG. 22 includes FIGS. 22A and 22B and illustrates orientation of FIGS. 22A and 22B, which

FIG. 23 includes FIGS. 23A and 23B and illustrates orientation of FIGS. 23A and 23B, which

FIG. 24 includes FIGS. 24A and 24B and illustrates orientation of FIGS. 24A and 24B, which

FIG. 25 includes FIGS. 25A and 25B and illustrates orientation of FIGS. 25A and 25B, which

FIG. 26 includes FIGS. 26A and 26B and illustrates orientation of FIGS. 26A and 26B, which FIGS. 26A and 26B illustrate a comprehensive fifth timing diagram of the circuitry of FIGS. 15–21;

FIG. 27 includes FIGS. 27A and 27B and illustrates orientation of FIGS. 27A and 27B, which

FIG. 28 includes FIGS. 28A and 28B and illustrates orientation of FIGS. 28A and 28B, which FIG. 29 includes FIGS. 29A and 29B and illustrates orientation of FIGS. 29A and 29B, which

BEST MODE(S) FOR CARRYING OUT THE INVENTION

Reference is now made in detail to a specific embodiment of the present invention which illustrates the best mode presently contemplated by the inventors for practicing the invention.

Figure 1:
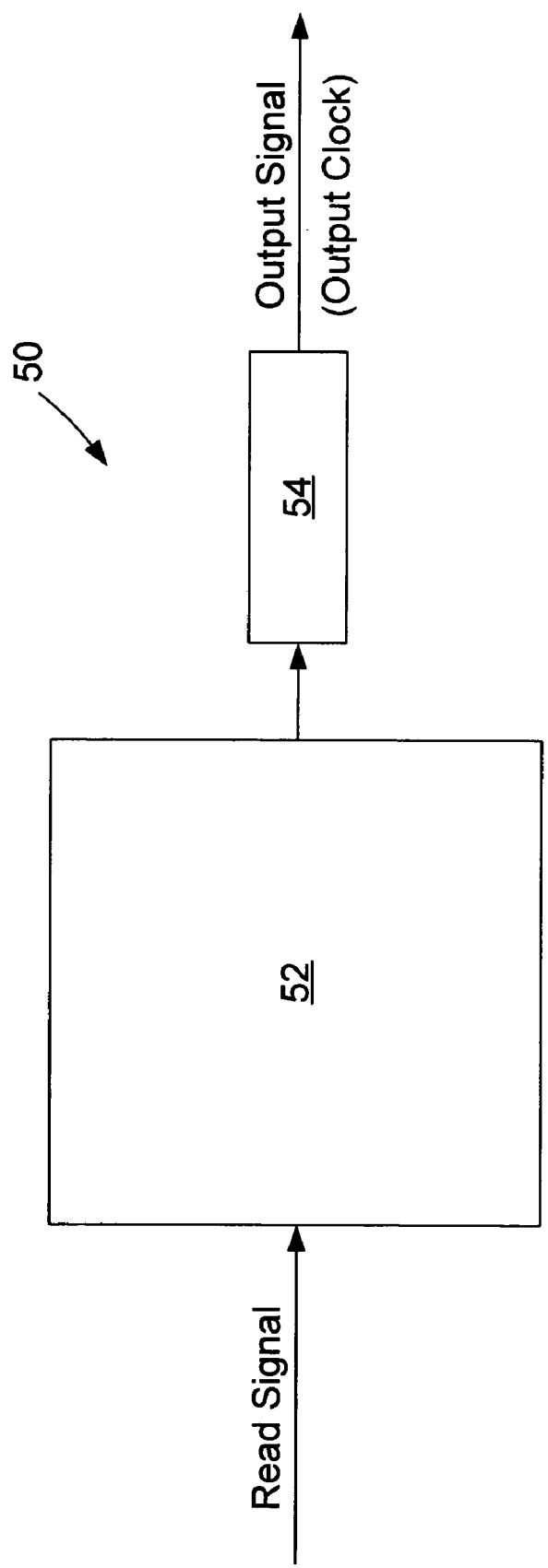
FIG. 1 illustrates an embodiment of memory structure.
Figure 2:
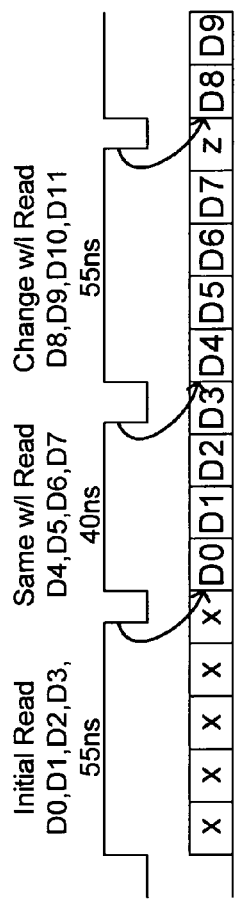
FIGS. 2A–2D are timing diagrams illustrating the operation of the memory structure of FIG. 1 at a first output frequency for a first set of data operations in accordance with the prior art.
Figure 2:
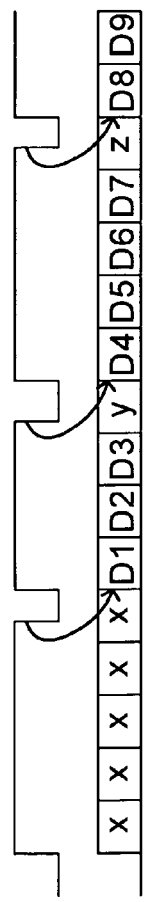
Figure 2:
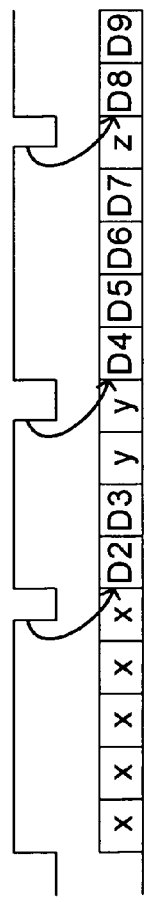
Figure 2:
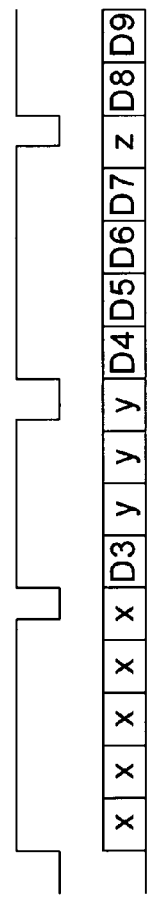
Figure 8:
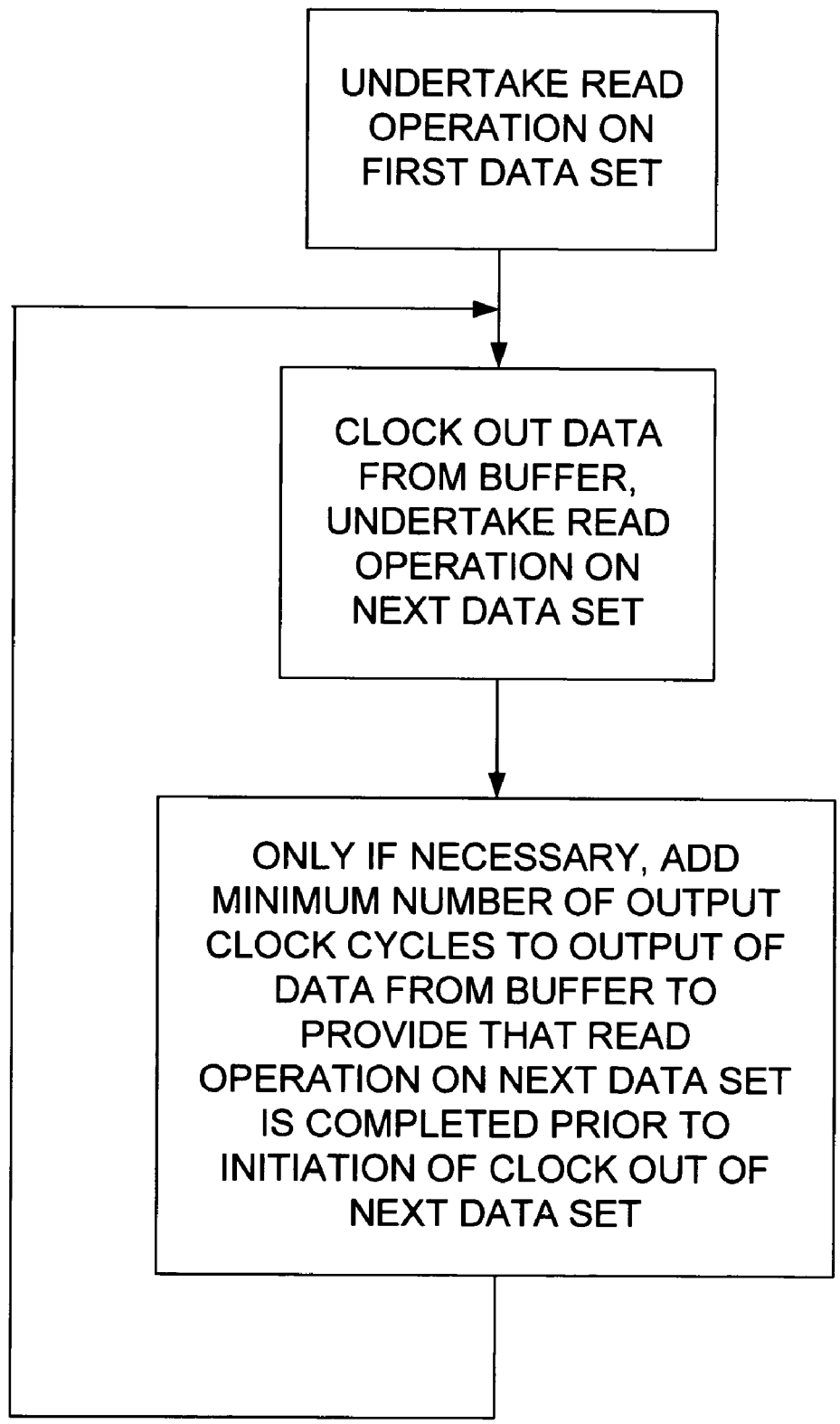
FIG. 8 is a flow diagram illustrating operation of the present invention.

Referring again to FIG. 1, there is illustrated a memory structure 50 which includes a flash memory 52 and a buffer 54. In general, a read operation is undertaken to read data in the memory 52 and provide such data to the buffer 54. The data provided to the buffer 54 is then clocked out, as an output from the memory structure 50. Successive memory read operations provide successive data sets to the buffer 54, which are successively clocked out as outputs from the memory structure 50. In the present situation, the operation of the memory structure 50 is illustrated by the flow chart of FIG. 8 and with reference to the timing diagrams of FIGS. 9–14. As will be seen, contrary to the previous examples, time delays are included only as needed.

Figure 9:
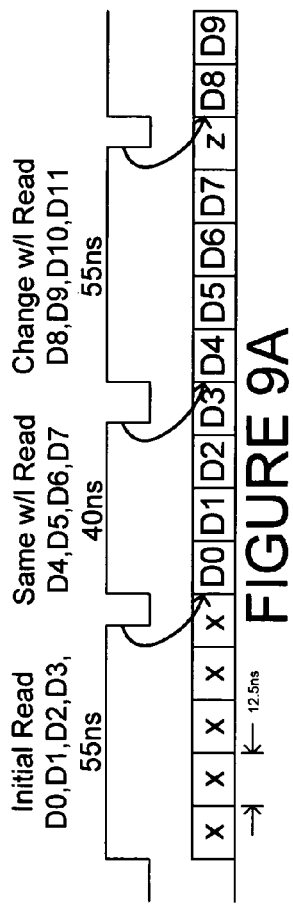
FIGS. 9A–9D are timing diagrams illustrating the operation of the memory structure of FIG. 1 at the first output frequency for a first set of data operations in accordance with the present invention.
Figure 9:
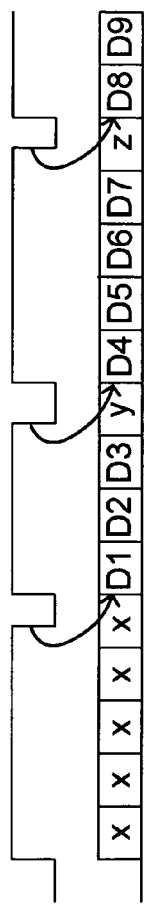
Figure 9:
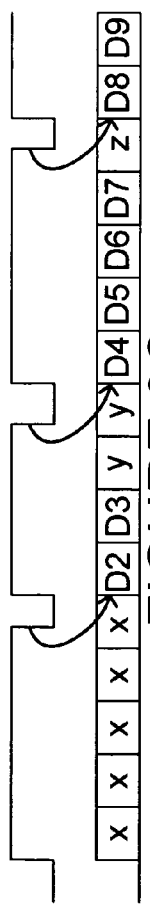
Figure 9:
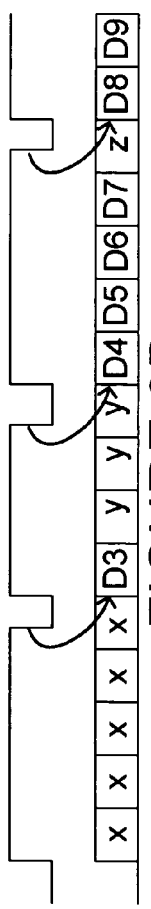

FIGS. 9–11 illustrate timing diagrams wherein change of word line occurs after the second read. Referring to FIG. 9A, an initial or first read signal accesses and reads a data set of four data words D0, D1, D2, D3 in the memory 52, and loads those data words D0, D1, D2, D3 in the buffer 54. This data set is loaded in the buffer 54 in 55 ns, which is the time needed to boost a word line associated with the accessing of this data set (15 ns), and to sense and load the four data words D0, D1, D2, D3 into the buffer 54 (40 ns). Meanwhile, in this example, an output clock is running at a frequency of 80 MHz. In order to undertake an output operation of the data words D0, D1, D2, D3, all such data words D0, D1, D2, D3 must be in the buffer 54, i.e., the read operation of those data words must be completed prior to undertaking an output operation thereof. In furtherance thereof, a series of successive initial time delays (x) of the output operation are included, each time delay (x) being equal to a single clock cycle of the output clock, in this embodiment, 12.5 ns. Thus, in this example, the number of time delays (x) provided is five, and each time delay (x)=12.5 ns for a total of 62.5 ns delay from the initiation of the read operation, which time of 62.5 ns exceeds the read time operation of 55 ns, to ensure that all data words D0, D1, D2, D3 are in the buffer 54 prior to an output thereof (FIG. 9A).

After and upon completion of this period of 62.5 ns, data in the buffer 54 is clocked out as an output from the memory structure 50, with each data word clocked out in one clock cycle, i.e., one data word per 12.5 ns. In this example, in the first output operation, the four data words D0, D1, D2, D3 are successively clocked out, so that the overall output operation takes 50 ns. Meanwhile, starting at the initiation of the output operation of the data words D0, D1, D2, D3, a second read operation is undertaken, in this example using the same word line as in accessing the first data set. Since this word line is already boosted, the 15 ns period for boosting a word line is not required, and complete reading of the next set of data made up of data words D4, D5, D6, D7 requires 40 ns. The second read operation, initiated at the same time as the start of the output operation of data words D0, D1, D2, D3, is completed prior to the completion of the output operation of data words D0, D1, D2, D3 (40 ns v. 50 ns), and thus all data words D4, D5, D6, D7 are in the buffer 54 in time for the initiation of output therefrom immediately upon completion of the output of the data words D0, D1, D2, D3.

In the second output operation, the four data words D4, D5, D6, D7 are then successively clocked out, so that overall the second output operation takes 50 ns. Meanwhile, starting at the initiation of the output of the data words D4, D5, D6, D7, a third read operation is undertaken, in this example using a different word line. A third read signal accesses and reads a data set of four data words D8, D9, D10, D11 in the memory 52, and loads those data words D8, D9, D10, D11 in the buffer 54. This data set is provided to the buffer 54 in 55 ns, which is the time taken to boost a new word line associated with the accessing of this data (15 ns), and to sense and load the four data words D8, D9, D10, D11 into the buffer 54 (40 ns). The third read operation (55 ns), initiated at the same time as the start of the output operation of the data words D4, D5, D6, D7, is not completed prior to the completion of this output operation (50 ns), and all data words D8, D9, D10, D11 are not in the buffer 54 at completion of the output of the data words D4, D5, D6, D7, i.e., the third read operation is not yet complete. In such situation, a time delay (z) is needed and added to the output cycle at the completion of the output of the data words D4, D5, D6, D7, equal to a single clock cycle of the output clock, in this embodiment, 12.5 ns. With the output of the data words D4, D5, D6, D7 requiring 50 ns, and with the delay of (z)=12.5 ns added thereto (total of 62.5 ns), the output of data words D8, D9, D10, D11 will not begin until after completion of the read operation of data words D8, D9, D10, D11 (55 ns), ensuring that all data words D8, D9, D10, D11 are in the buffer 54 prior to initiation of output thereof from the buffer 54.

FIG. 9B illustrates a situation similar to the illustrated in FIG. 9A. However, with output from the buffer 54 starting with data word D1 rather than data word D0. In the first output operation, only data words D1, D2, D3 are successively output, requiring 37.5 ns. The output operation of the data words D1, D2, D3 is completed prior to completion of the read operation of the data words D4, D5, D6, D7, and all data words D4, D5, D6, D7 are not loaded in the buffer 54 at completion of the output of the data words D1, D2, D3, i.e., the read operation of data words D4, D5, D6, D7 is not yet complete. In such situation, a time delay (y) is needed and added to the output cycle at the completion of the output of the data words D1, D2, D3, equal to a single clock cycle of the output clock, in this embodiment, 12.5 ns. With the output of the data words D1, D2, D3 requiring 37.5 ns, and with the delay (y) of 12.5 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. It will be noted that the situation in regard to addition of the time delay (z) remains the same.

FIG. 9C illustrates a situation similar to those illustrated in FIGS. 9A and 9B. However, in this example the output from the buffer 54 starts with data word D2. In the first output operation, only data words D2, D3 are successively output, requiring 25 ns. The output operation of the data words D2, D3 is completed prior to completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not yet complete. In such situation, a time delay (y+y) is needed and added to the output cycle at the completion of the output of the data words D2, D3, (y) being equal to a single clock cycle of the output clock, in this embodiment, 12.5 ns. With the output of the data words D2, D3 requiring 25 ns, and with the delay (y+y) of 25 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. It will be noted that the situation in regard to addition of the time delay (z) remains the same.

FIG. 9D illustrates a situation similar to those illustrated in FIGS. 9A, 9B and 9C. However, in this example the output from the buffer 54 starts with data word D3. In the first output operation, only data word D3 is output, requiring 12.5 ns. The output operation of the data word D3 is completed prior to completion of the read operation of the data words D4, D5, D6, D7, and all data words D4, D5, D6, D7 are not loaded in the buffer 54 at completion of the output of the data word D3, i.e., the read operation of data words D4, D5, D6, D7 is not yet complete. In such situation, a time delay (y+y+y) is needed and added to the output cycle at the completion of the output of the data word D3, y being equal to a single clock cycle of the output clock, in this embodiment, 12.5 ns. With the output of the data word D3 requiring 12.5 ns, and with the delay (y+y+y) of 37.5 ns added thereto (total of 50 ns), the output of data words D4, D5, D6, D7 will not begin until after completion of the read operation of data words D4, D5, D6, D7 (40 ns), ensuring that all data words D4, D5, D6, D7 are in the buffer 54 prior to initiation of output thereof from the buffer 54. Again, the situation in regard to addition of the time delay (z) remains the same.

In the example of FIG. 10A, similar to the example of FIG. 9A, an initial or first read signal accesses and reads a data set of four data words D0, D1, D2, D3 in the memory 52, and loads those data words D0, D1, D2, D3 in the buffer 54. This data set is loaded in the buffer 54 in 55 ns, which is the time needed to boost a word line associated with the accessing of this data set (15 ns), and to sense and load the four data words D0, D1, D2, D3 into the buffer 54 (40 ns). Meanwhile, in this example, an output clock is running at a frequency of 57 MHz, slower than in the previous example. In order to undertake an output operation of the data words D0, D1, D2, D3, all such data words D0, D1, D2, D3 must be in the buffer 54, i.e., the read operation of those data words must be completed prior to undertaking an output operation thereof. In furtherance thereof, a series of successive initial time delays (x) of the output operation are included, each time delay (x) being equal to a single clock cycle of the output clock, in this embodiment, 17.5 ns. Thus, in this example, the number of time delays (x) provided is four, and each time delay (x)=17.5 ns for a total of 70 ns delay from the initiation of the read operation, which time of 70 ns exceeds the read time operation of 55 ns, to ensure that all data words D0, D1, D2, D3 are in the buffer 54 prior to an output thereof (FIG. 10A).

After and upon completion of this period of 70 ns, data in the buffer 54 is clocked out as an output from the memory structure, with each data word clocked out in one clock cycle, i.e., one data word per 17.5 ns. In this example, in the first output operation, the four data words D0, D1, D2, D3 are successively clocked out, so that the overall output operation takes 70 ns. Meanwhile, starting at the initiation of the output operation of the data words D0, D1, D2, D3, a second read operation is undertaken, in this example using the same word line as in accessing the first data set. Since this word line is already boosted, the 15 ns period for boosting a word line is not required, and complete reading of the next set of data made up of data words D4, D5, D6, D7 requires 40 ns. The second read operation, initiated at the same time as the start of the output operation of data words D0, D1, D2, D3, is completed prior to the completion of the output operation of data words D0, D1, D2, D3 (40 ns v. 70 ns), and thus all data words D4, D5, D6, D7 are in the buffer 54 in time for the initiation of output therefrom immediately upon completion of the output of the data words D0, D1, D2, D3.

Figure 3:
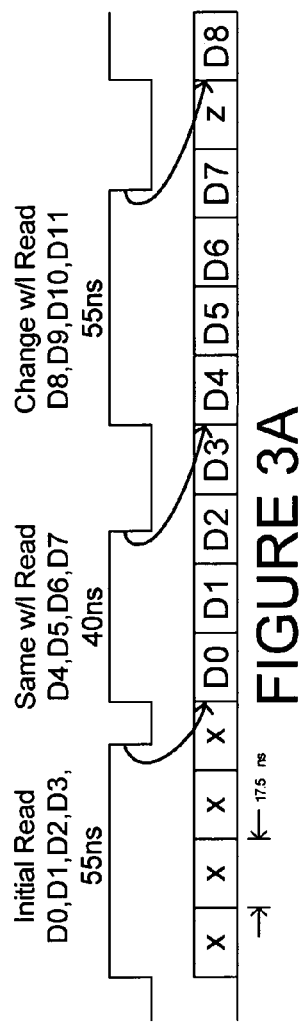
FIGS. 3A–3D are timing diagrams illustrating the operation of the memory structure of FIG. 1 at a second output frequency for the first set of data operations in accordance with the prior art.
Figure 3:
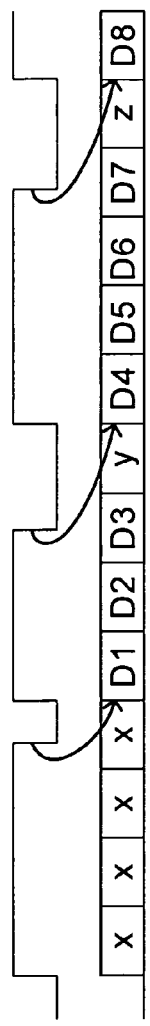
Figure 3:
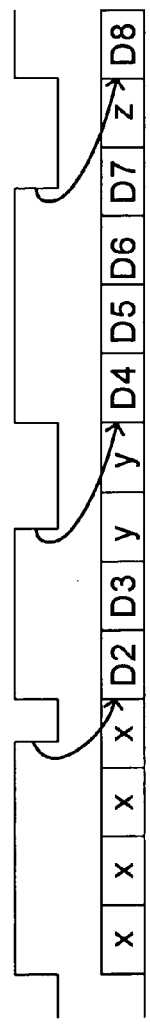
Figure 3:
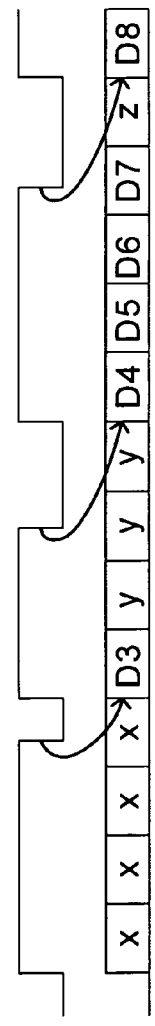
Figure 4:
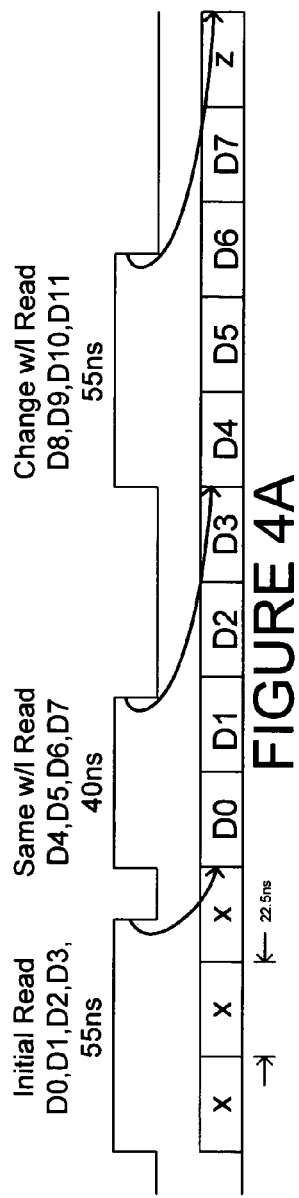
FIGS. 4A–4D are timing diagrams illustrating the operation of the memory structure of FIG. 1 at a third output frequency for the first set of data operations in accordance with the prior art.
Figure 4:
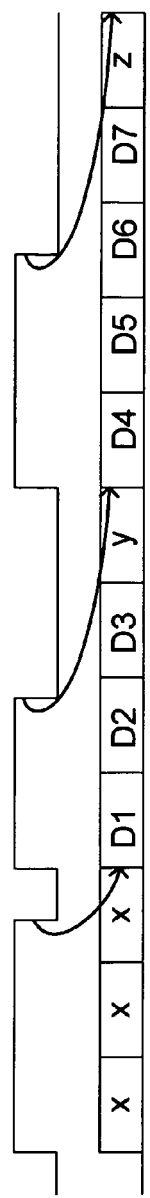
Figure 4:
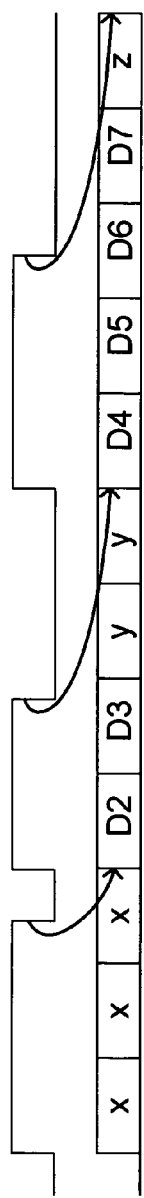
Figure 4:
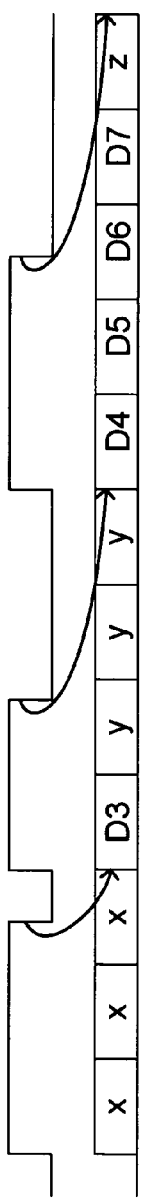
Figure 5:
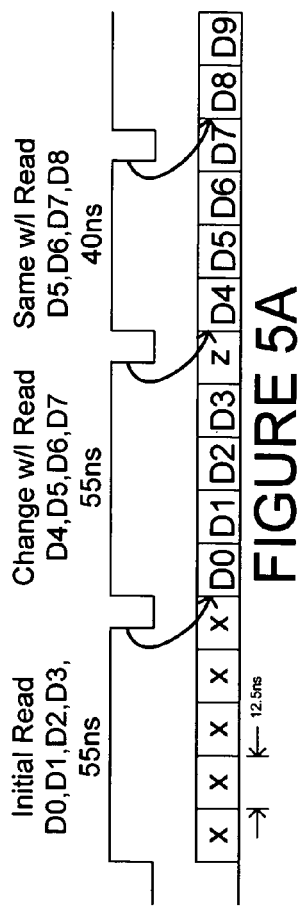
FIGS. 5A–5D are timing diagrams illustrating the operation of the memory structure of FIG. 1 at the first output frequency for a second set of data operations in accordance with the prior art.
Figure 5:
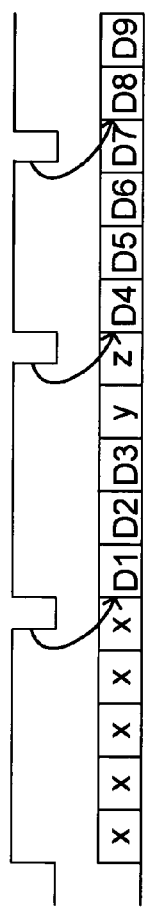
Figure 5:
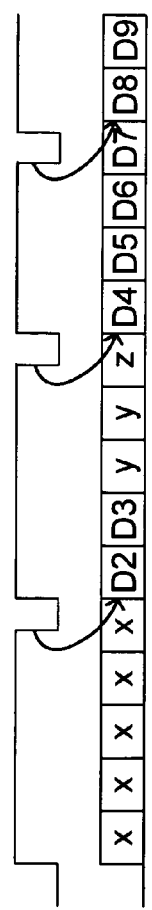
Figure 5:
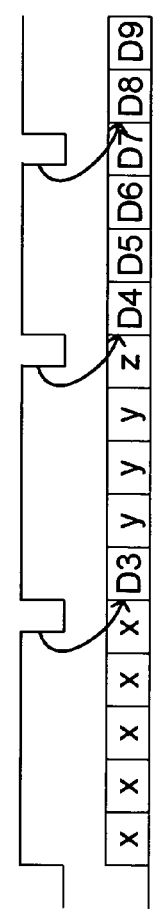
Figure 6:
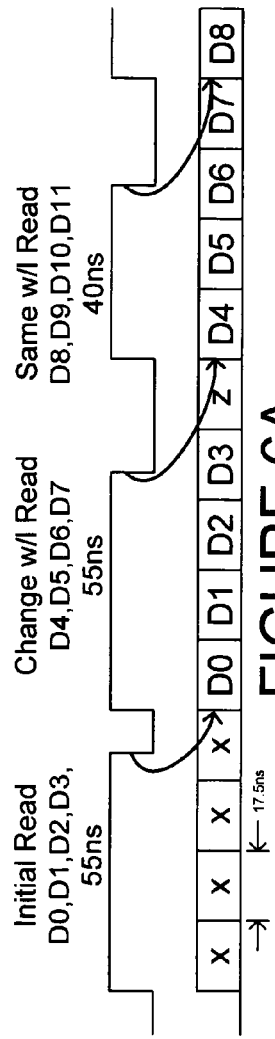
FIGS. 6A–6D are timing diagrams illustrating the operation of the memory structure of FIG. 1 at the second output frequency for the second set of data operations in accordance with the prior art.
Figure 6:
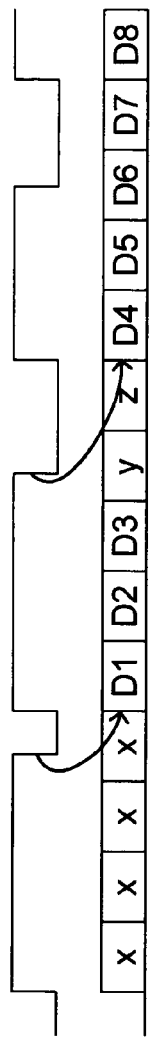
Figure 6:
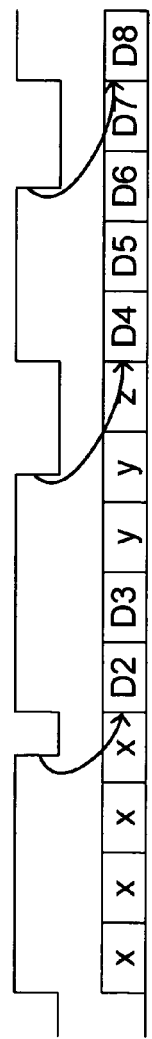
Figure 6:
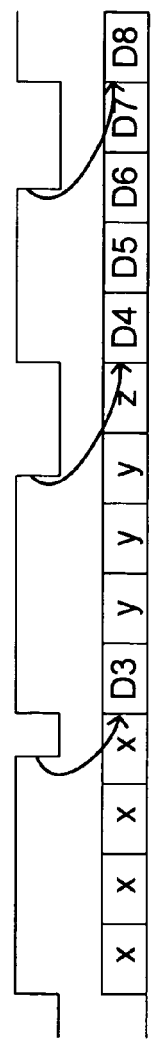

In the second output operation, the four data words D4, D5, D6, D7 are then successively clocked out, so that overall the second output operation takes 70 ns. Meanwhile, starting at the initiation of the output of the data words D4, D5, D6, D7, a third read operation is undertaken, in this example using a different word line. A third read signal accesses and reads a data set of four data words D8, D9, D10, D11 in the memory, and loads those data words D8, D9, D10, D11 in the buffer 54. This data set is provided to the buffer 54 in 55 ns, which is the time taken to boost a new word line associated with the accessing of this data (15 ns), and to sense and load the four data words D8, D9, D10, D11 into the buffer 54 (40 ns). The third read operation (55 ns), initiated at the same time as the start of the output operation of the data words D4, D5, D6, D7, is completed prior to the completion of this output operation (60 ns), and all data words D8, D9, D10, D11 are in the buffer 54 at completion of the output of the data words D4, D5, D6, D7, i.e., the third read operation is complete. However, in the present situation the time delay (z), not needed and not built into the system, is not added to the output cycle at the completion of the output of the data words D4, D5, D6, D7 as in the previous corresponding example (FIG. 3A). With the time delay (z) not included, unnecessary slowing down of the output operation avoided, and the output operation continues with the output of data words D8, D9, D10, D11 immediately after completion of the output of the data words D4, D5, D6, D7.

FIG. 10B illustrates a situation similar to the illustrated in FIG. 10A. However, the output from the buffer 54 in this example starts with data word D1. In the first output operation, only data words D1, D2, D3 are successively output, requiring 52.5 ns. The output operation of the data words D1, D2, D3 is completed after completion of the read operation of the data words D4, D5, D6, D7, and all data words D4, D5, D6, D7 are loaded in the buffer 54 at completion of the output of the data words D1, D2, D3, i.e., the read operation of data words D4, D5, D6, D7 is complete. However, the time delay (y), not needed and not built into the system, is not added to the output cycle at the completion of the output of the data words D1, D2, D3, as in the corresponding previous example (FIG. 3B). Thus, unnecessary slowing down of the output operation is avoided, and continues with the output of data words D4, D5, D6, D7 immediately after completion of the output of the data words D1, D2, D3. It will be noted that the situation in regard to addition of the time delay (z) remains the same, i.e., the time delay (z) is not needed and not included.

FIG. 10C illustrates a situation similar to that illustrated in FIGS. 10A and 10B. However, the output in this example starts with data word D2. In the first output operation, only data words D2, D3 are successively output, requiring 35 ns. The output operation of the data words D2, D3 is completed before completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not complete. It will be noted that only a single time delay (y)=17.5 ns (one output clock cycle) is needed after the output of data word D3 to insure loading of the data words D4, D5, D6, D7 in the buffer 54 prior to their being clocked out. Only one time delay (y) is needed in this situation, rather than the two (y+y) of the previous corresponding example (FIG. 3C), and so only a single time delay (y) is so added, avoiding the delay of the second time delay (y). The output operation can continue with the output of data words D4, D5, D6, D after only one time delay (y) after completion of the output of the data words D2, D3. It will be noted that the situation in regard to addition of the time delay (z) remains the same, i.e., the time delay (z) is not needed and not included.

FIG. 10D illustrates a situation similar to that illustrated in FIGS. 10A, 10B and 10C. However, the output in this example starts with data word D3. In the first output operation, only data word D3 is output, requiring 17.5 ns. The output operation of the data word D3 is completed before completion of the read operation of the data words D4, D5, D6, D7, and all data words D4, D5, D6, D7 are not loaded in the buffer 54 at completion of the output of the data words D2, D3, i.e., the read operation of data words D4, D5, D6, D7 is not complete. It will be noted that two time delays (y+y)=35 ns (two output clock cycles) are needed after the output of data word D3 to insure loading of the data words D4, D5, D6, D7 in the buffer 54 prior to their being clocked out. Only two time delays (y+y) are needed in this situation, so only time delay (y+y) is included, and not time delay (y+y+y) as in the previous corresponding example (FIG. 3D). Thus, the output operation can continue with the output of data words D4, D5, D6, D7 with only two time delays (y+y) after completion of the output of the data words D3. It will be noted that the situation in regard to addition of the time delay (z) remains the same, i.e., the time delay (z) is not needed and is not included.

FIGS. 11A–11D are similar to FIGS. 10A–10D but illustrate an embodiment wherein the output clock runs at 44 MHz, so that data words or clock out at 22.5 ns each. In this case, it will be seen that no delay (z) is needed or included. In addition, if the output from the buffer 54 is started with data word D0, D1 or D2, no delay (y) is needed or included, and if the output from the buffer 54 is started with data word D3, only a single delay (y) is needed and included.

Figure 12:
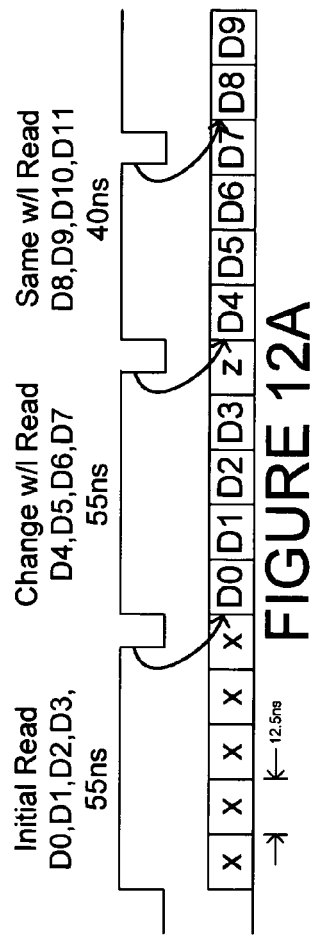
FIGS. 12A–12D are timing diagrams illustrating the operation of the memory structure of FIG. 1 at the first output frequency for a second set of data operations in accordance with the present invention.
Figure 12:
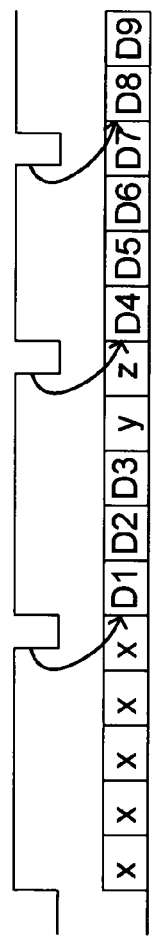
Figure 12:
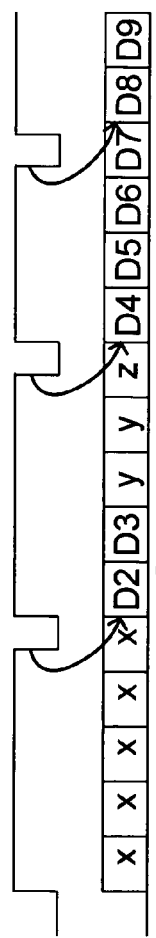
Figure 12:
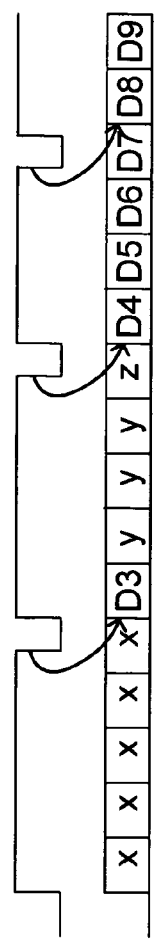
Figure 13:
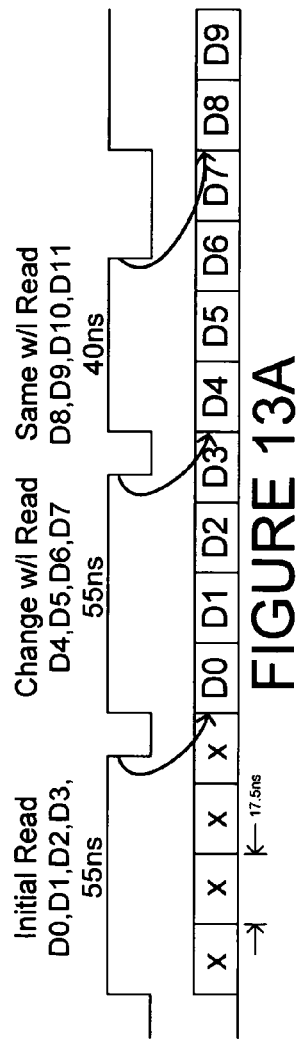
FIGS. 13A–13D are timing diagrams illustrating the operation of the memory structure of FIG. 1 at the second output frequency for the second set of data operations in accordance with the present invention.
Figure 13:
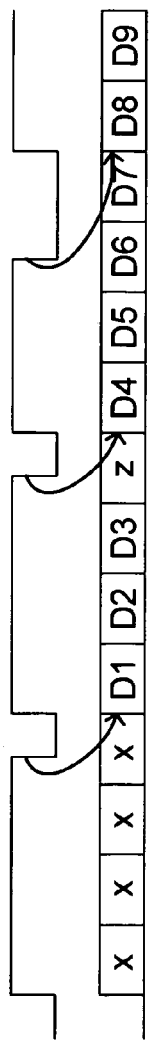
Figure 13:
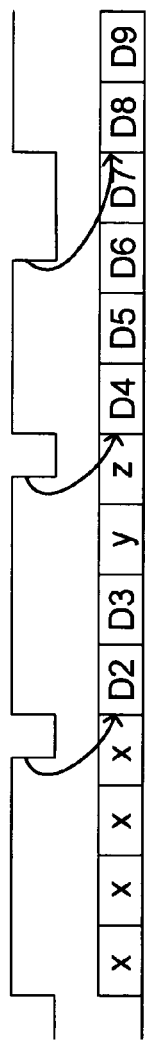
Figure 13:
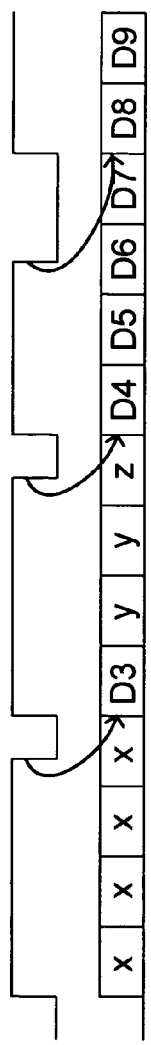

FIGS. 12–14 illustrate timing diagrams wherein the second read operation involves a change in word line from the first read operation, so that the second read operation takes 55 ns instead of 40 ns. The output frequency is provided as 80 MHz, so that each output cycle takes 12.5 ns. In FIG. 12A, with data output beginning at data word D0, a time delay (z) is added at the completion of the output of the data words D0, D1, D2, D3, to allow for the time of word line boost for the new word line. In FIG. 12B, with the output starting from data word D1, a time delay (y), in addition to time delay (z), is added at the completion of the output of the data words D1, D2, D3. In FIG. 12C, with the output starting from data word D2, a time delay (y+y), in addition to time delay (z), is added at the completion of the output of the data words D2, D3. In FIG. 12D, with the output starting from data word D3, a time delay (y+y+y), in addition to time delay (z), must be added at the completion of the output of the data word D3.

It will be seen that in accordance with the analysis, in the situation where the output clock is run at 57 MHz, so that each output cycle takes 17.5 ns, with data output beginning at data word D0 (FIG. 13A) no time delays are needed or included. Furthermore, with data output beginning at data word D1, time delay (z) is included and no time delay (y) is needed or included, with data output beginning at data word D2, time delay (z) is included and only a single time delay (y) is needed and included, and with the output beginning at data word D3, time delay (z) is included and only two time delays (y+y) are needed and included.

With reference to FIG. 14, with the output clock running at 44 MHz and with each clock cycle taking 22.5 ns, with data output beginning at data word D0 (FIG. 14A) or D1 (FIG. 14B), time delays are not needed and not included. The time delay (z), it will be seen, is included when the data output begins at data word D2 (FIG. 14C) or at data word D3 (FIG. 14D). Furthermore, with data output beginning at data word D0 (FIG. 14A), D1 (FIG. 14B) or D2 (FIG. 14C), no time delay (y) is needed or included. With data output beginning at data word D3 (FIG. 14D), only a single time delay (y) is needed and included.

Figure 22A:
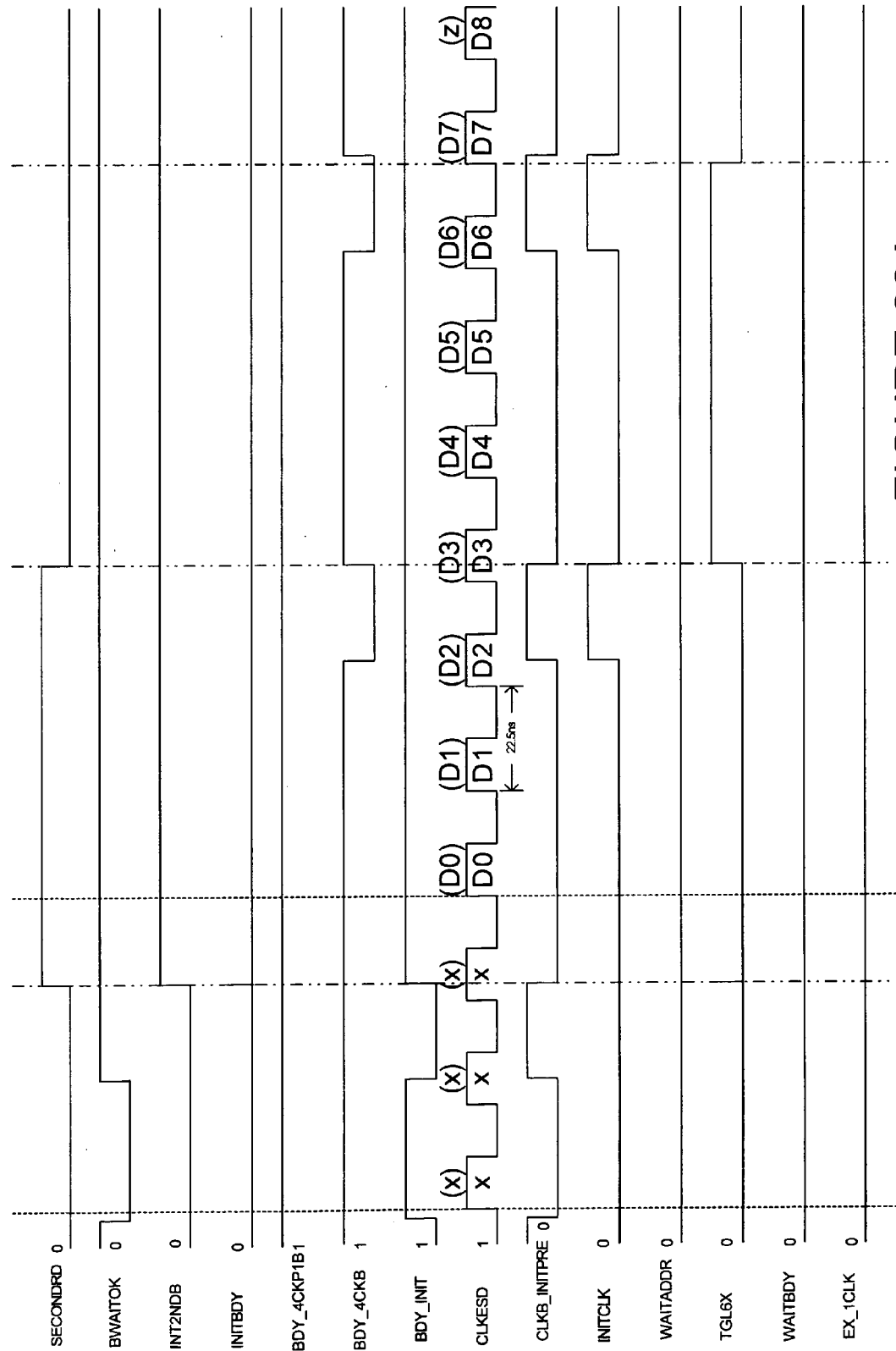
FIGS. 22A and 22B illustrate a comprehensive first timing diagram of the circuitry of FIGS. 15–21.
Figure 22B:
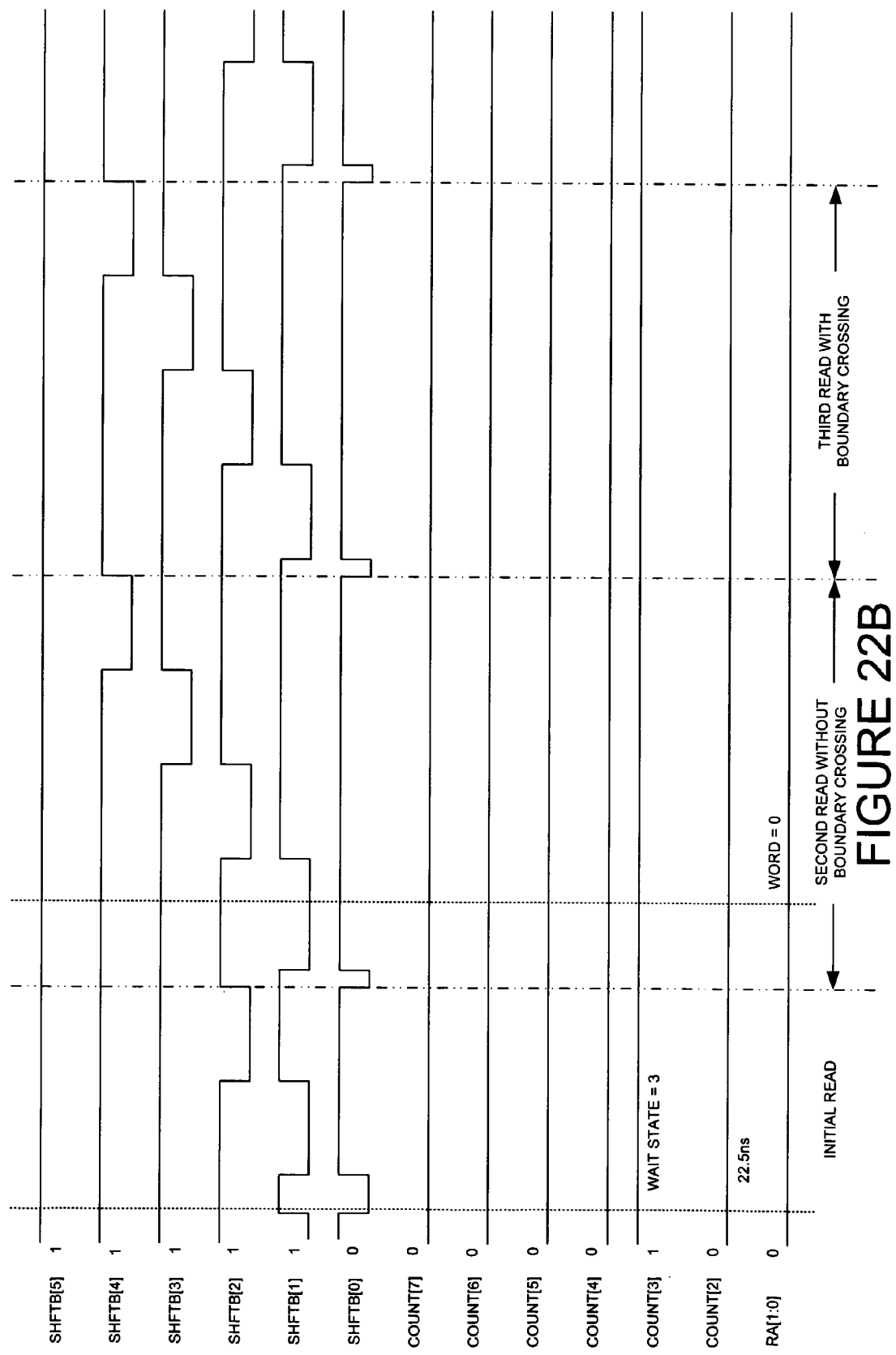
Figure 23A:
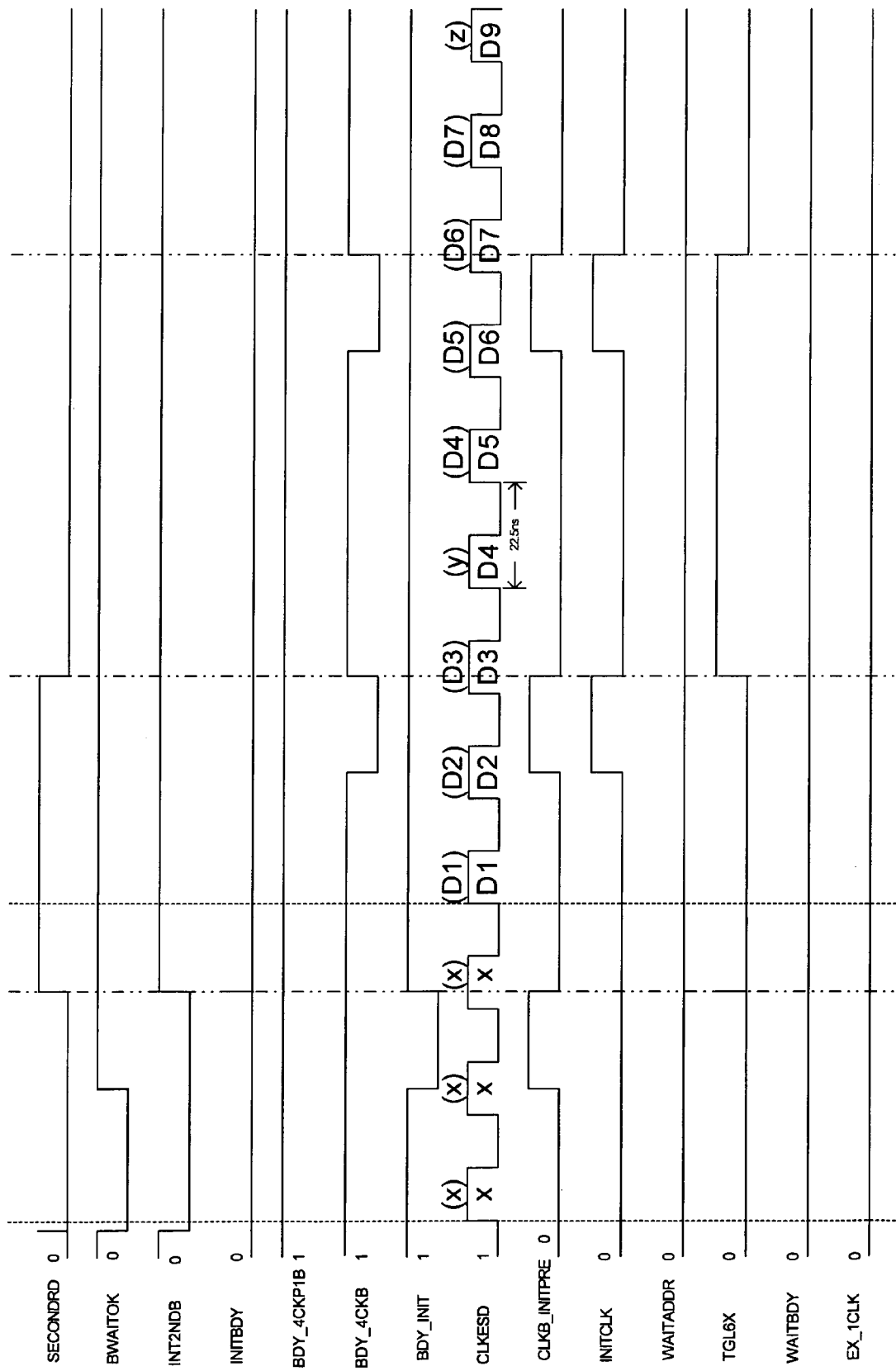
FIGS. 23A and 23B illustrate a comprehensive second timing diagram of the circuitry of FIGS. 15–21.
Figure 23B:
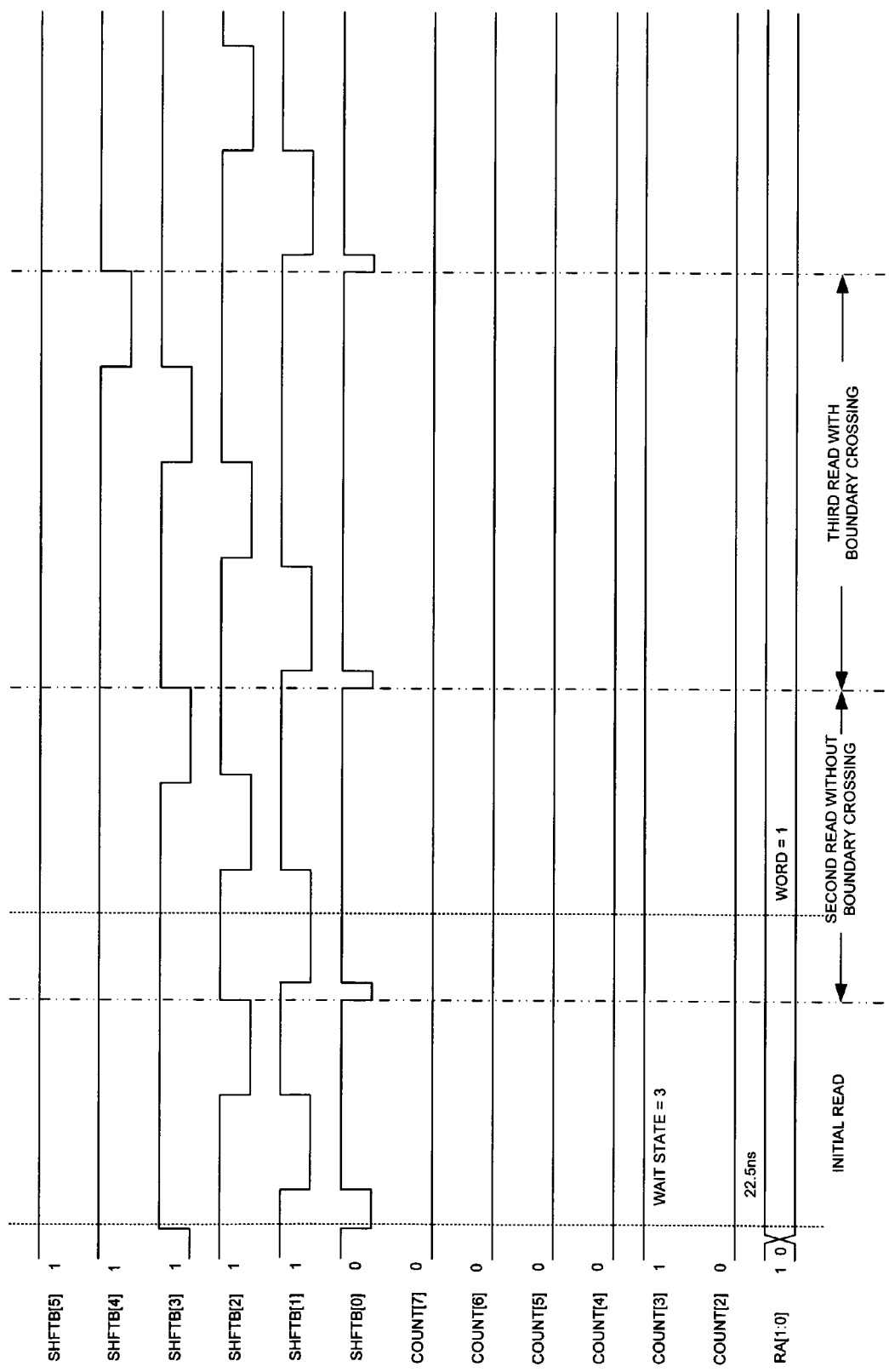
Figure 24A:
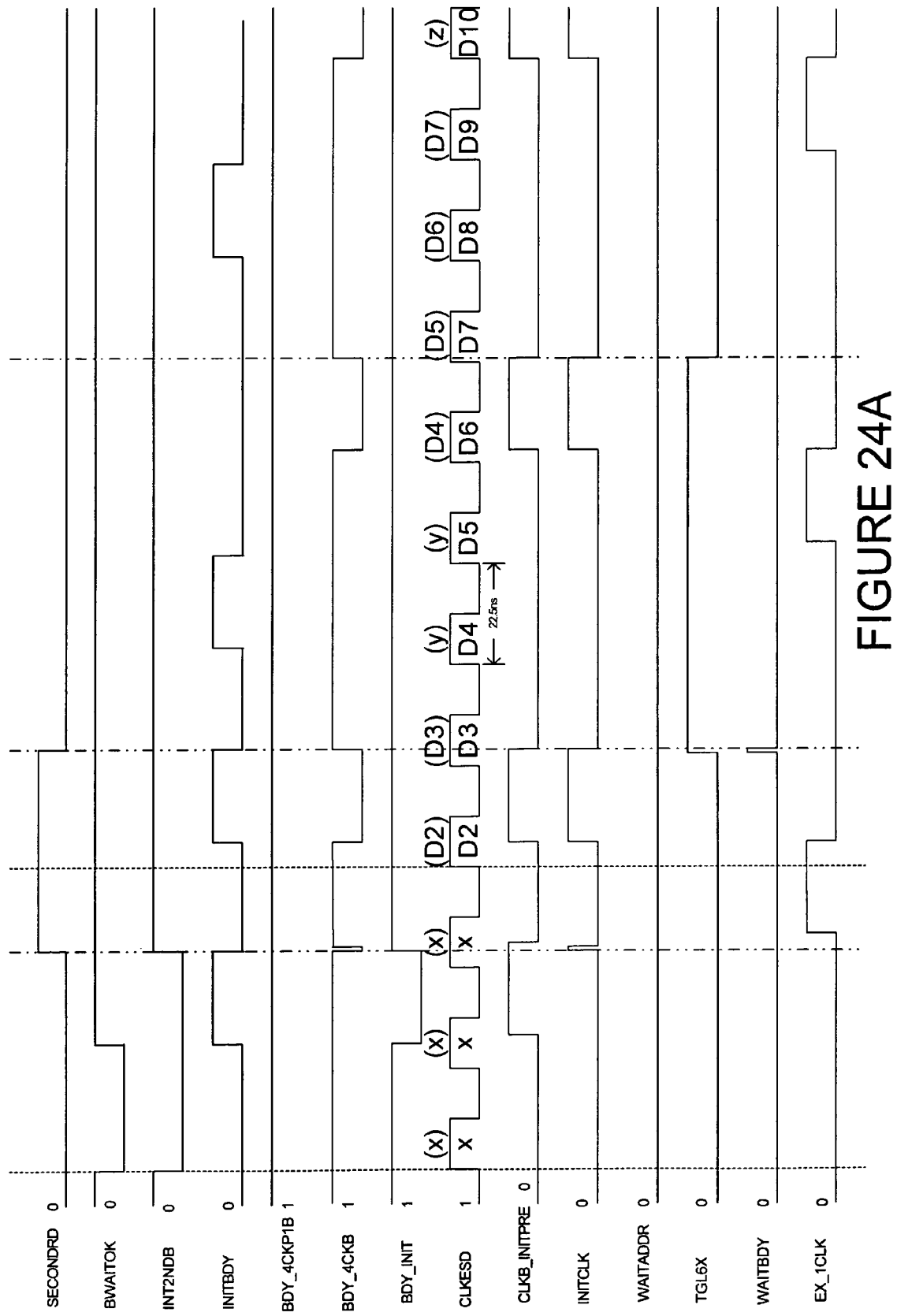
FIGS. 24A and 24B illustrate a comprehensive third timing diagram of the circuitry of FIGS. 15–21.
Figure 24B:
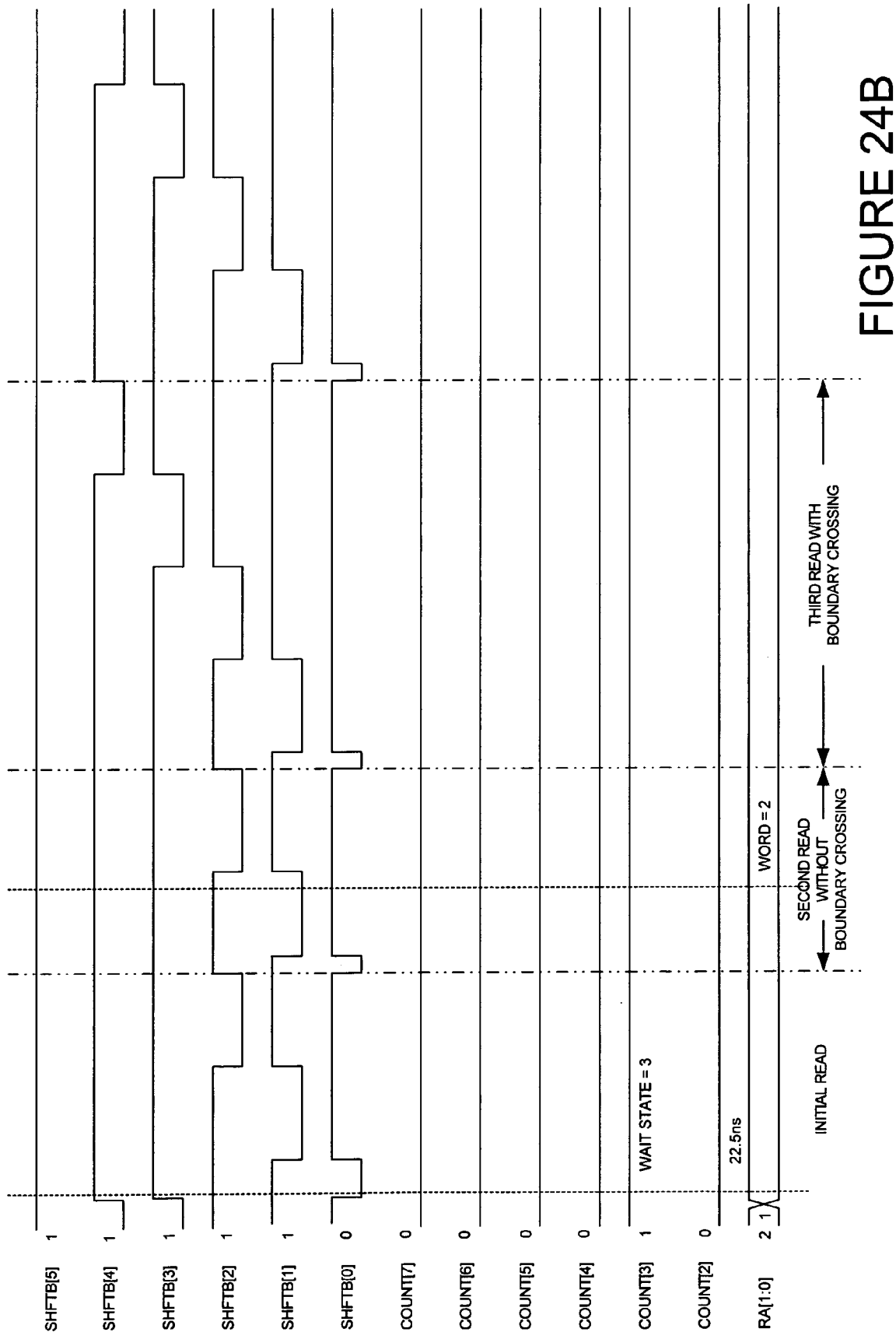
Figure 25A:
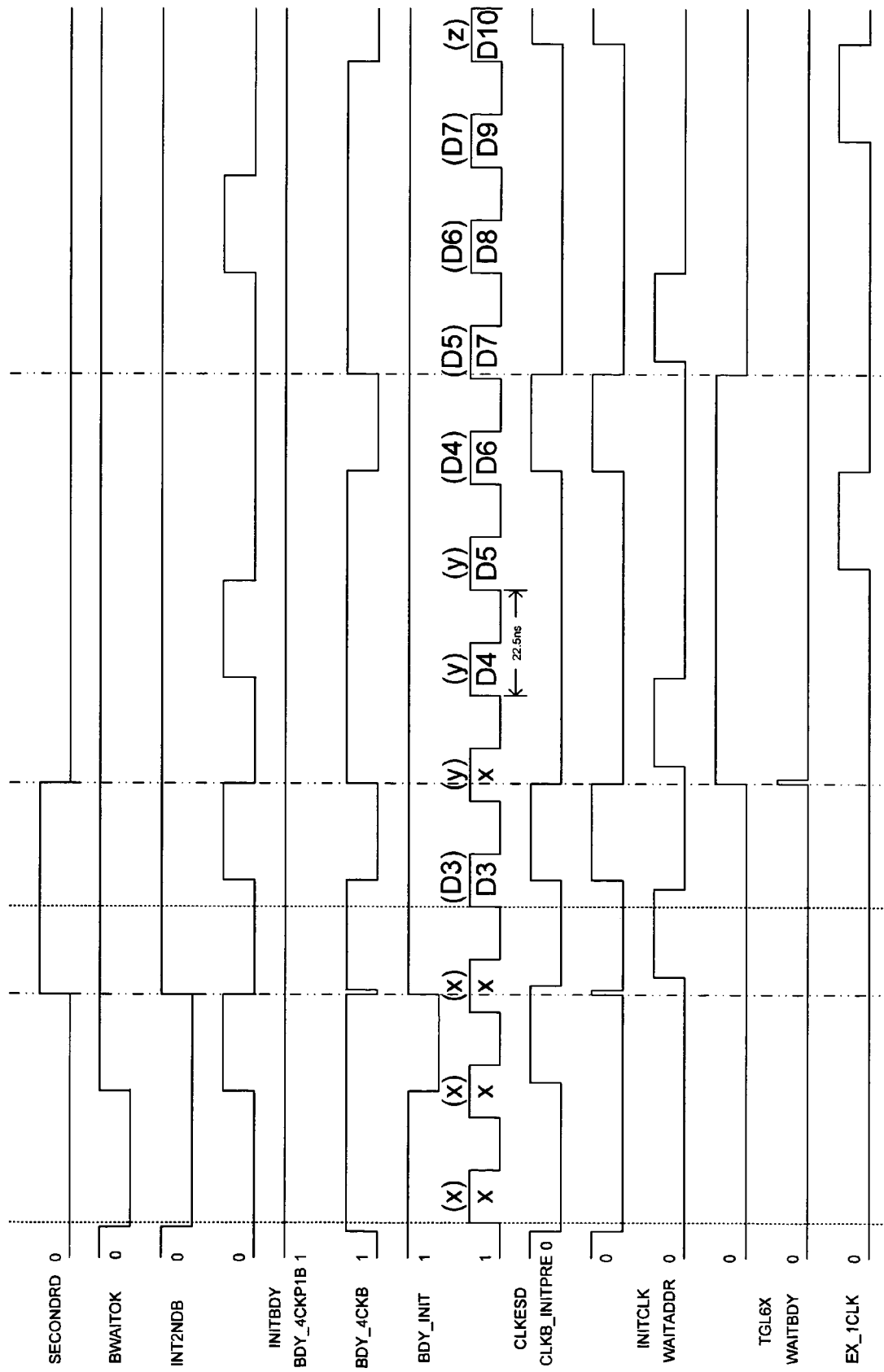
FIGS. 25A and 25B illustrate a comprehensive fourth timing diagram of the circuitry of FIGS. 15–21.
Figure 25B:
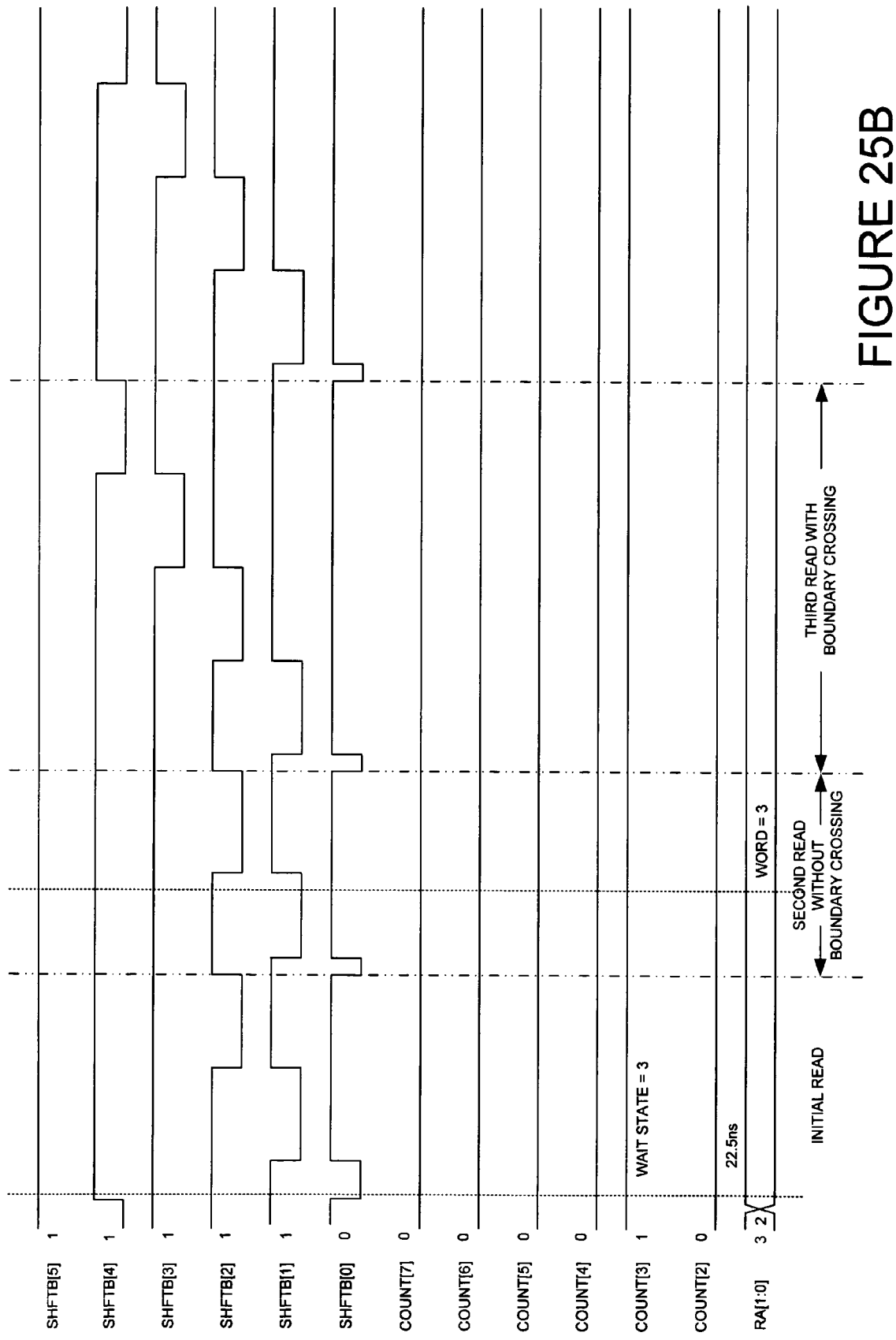
Figure 26A:
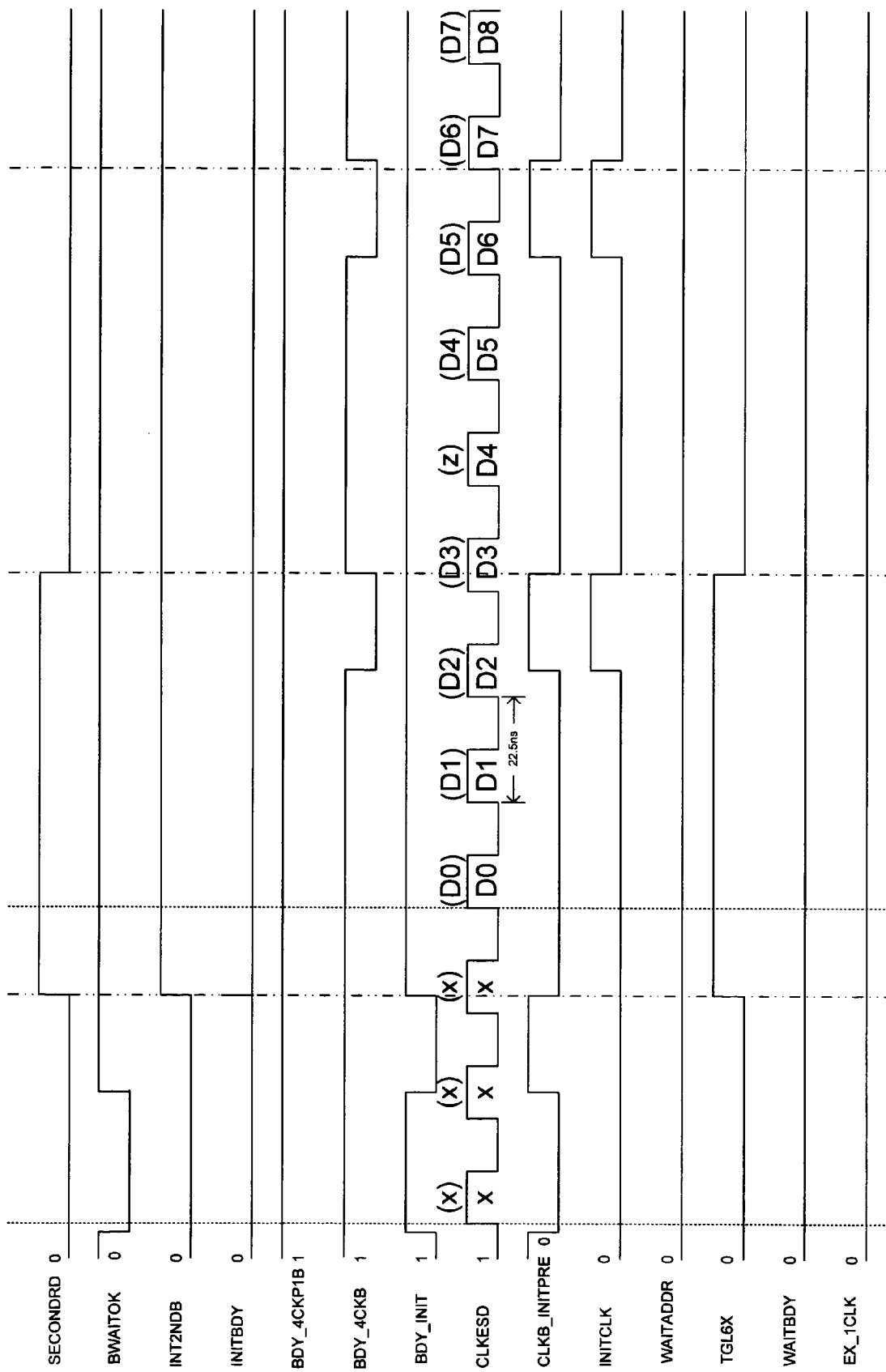
Figure 27A:
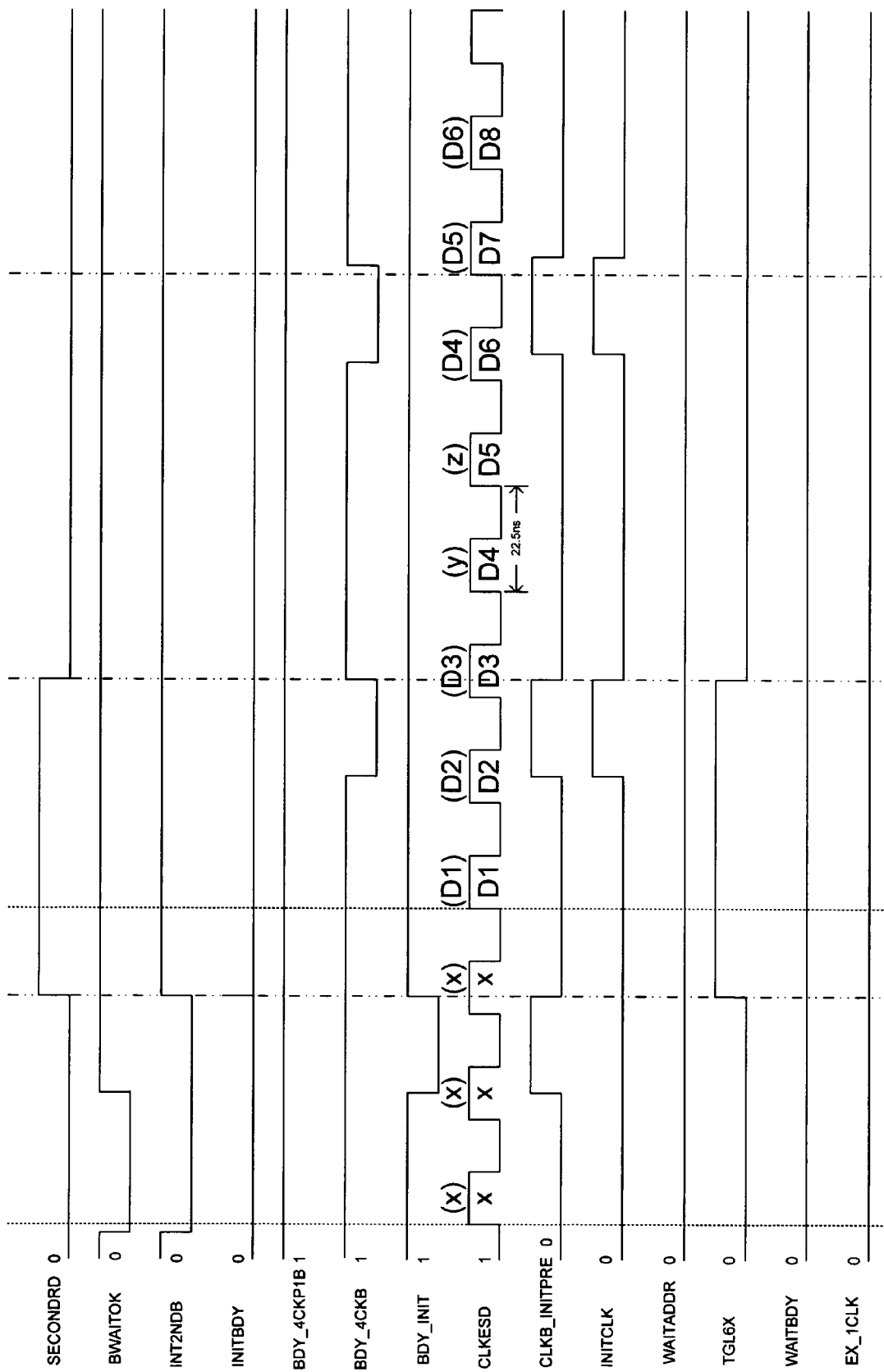
FIGS. 27A and 27B illustrate a comprehensive sixth timing diagram of the circuitry of FIGS. 15–21.
Figure 27B:
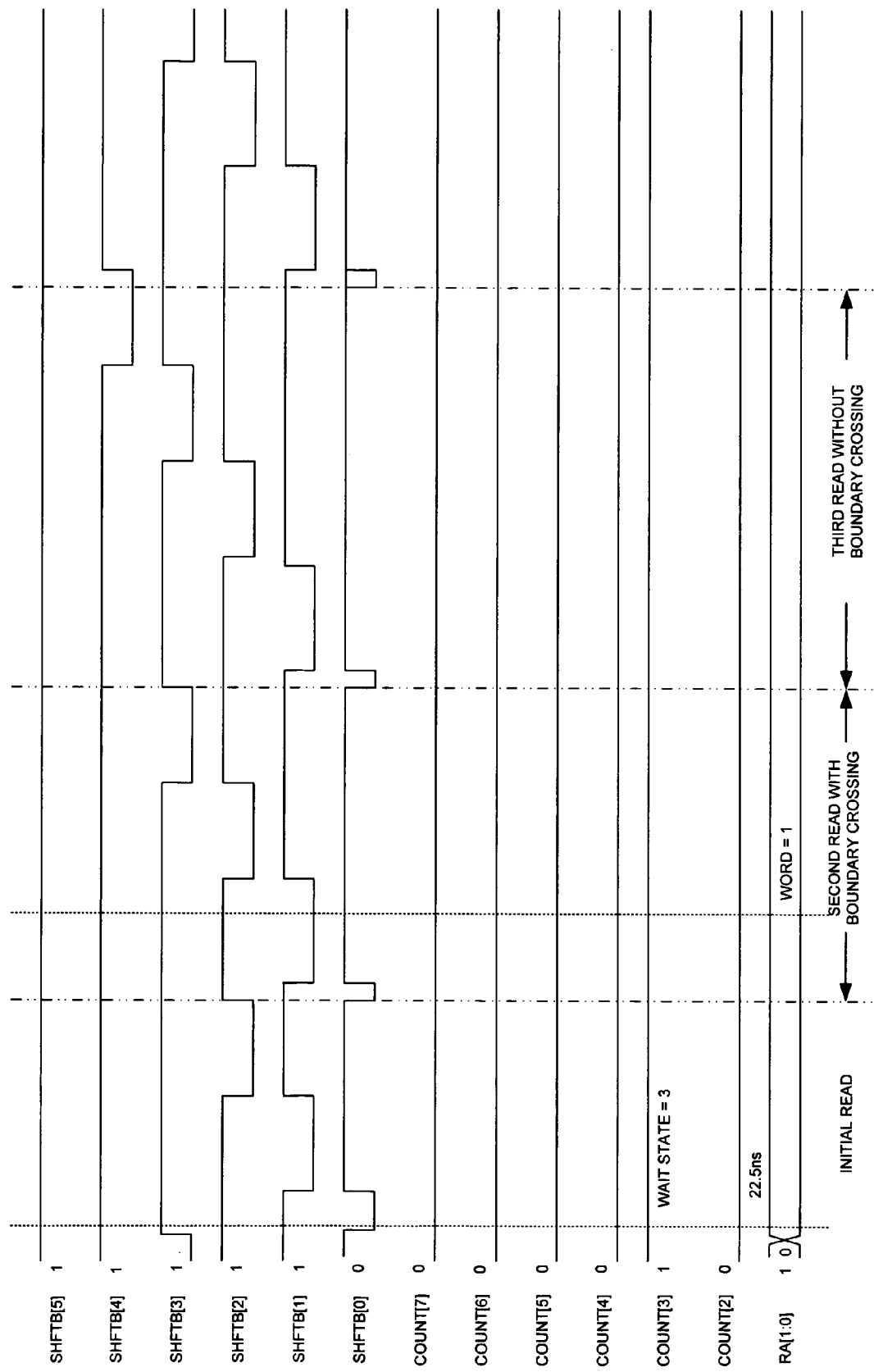
Figure 28A:
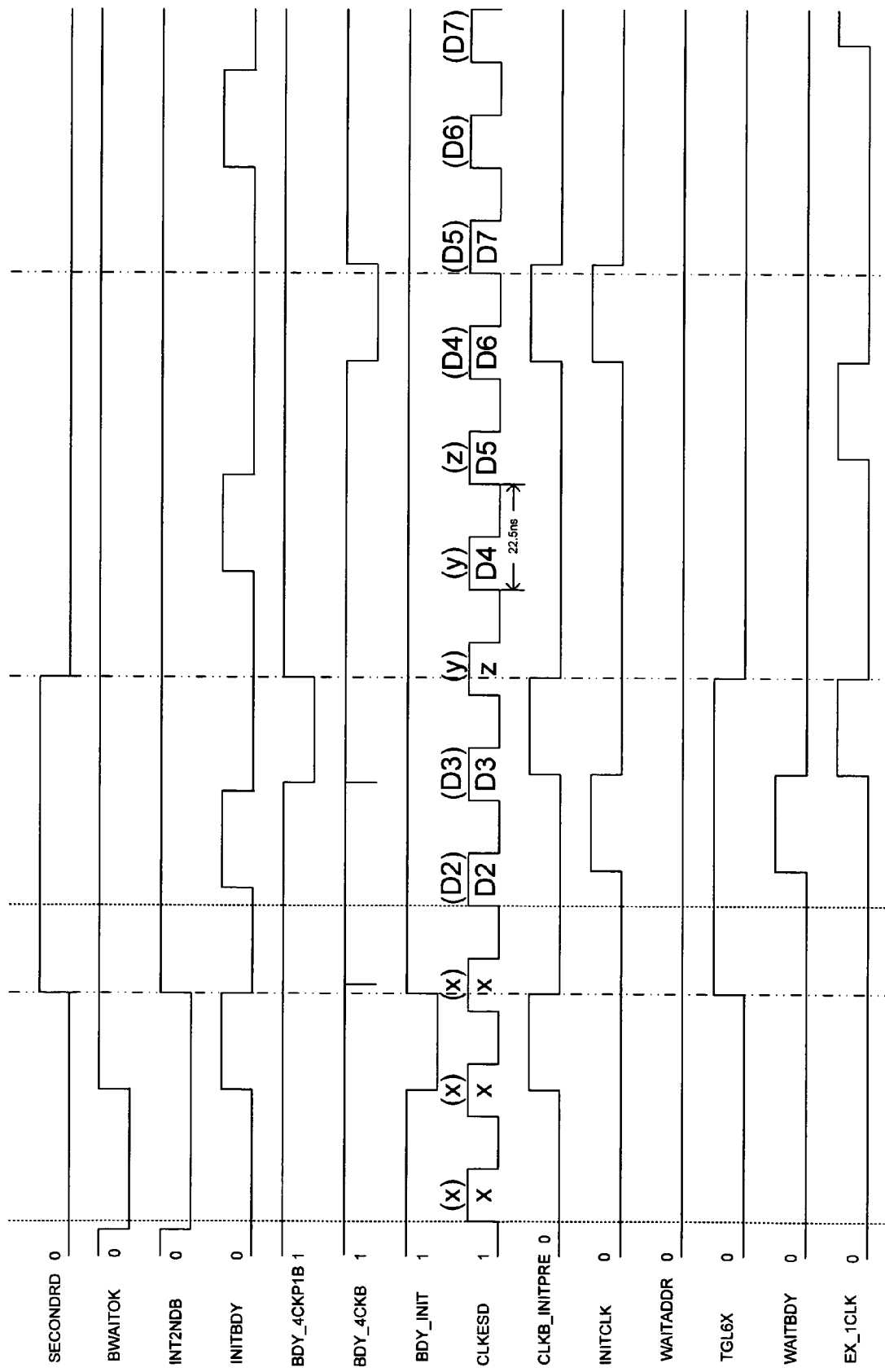
FIGS. 28A and 28B illustrate a comprehensive seventh timing diagram of the circuitry of FIGS. 15–21.
Figure 28B:
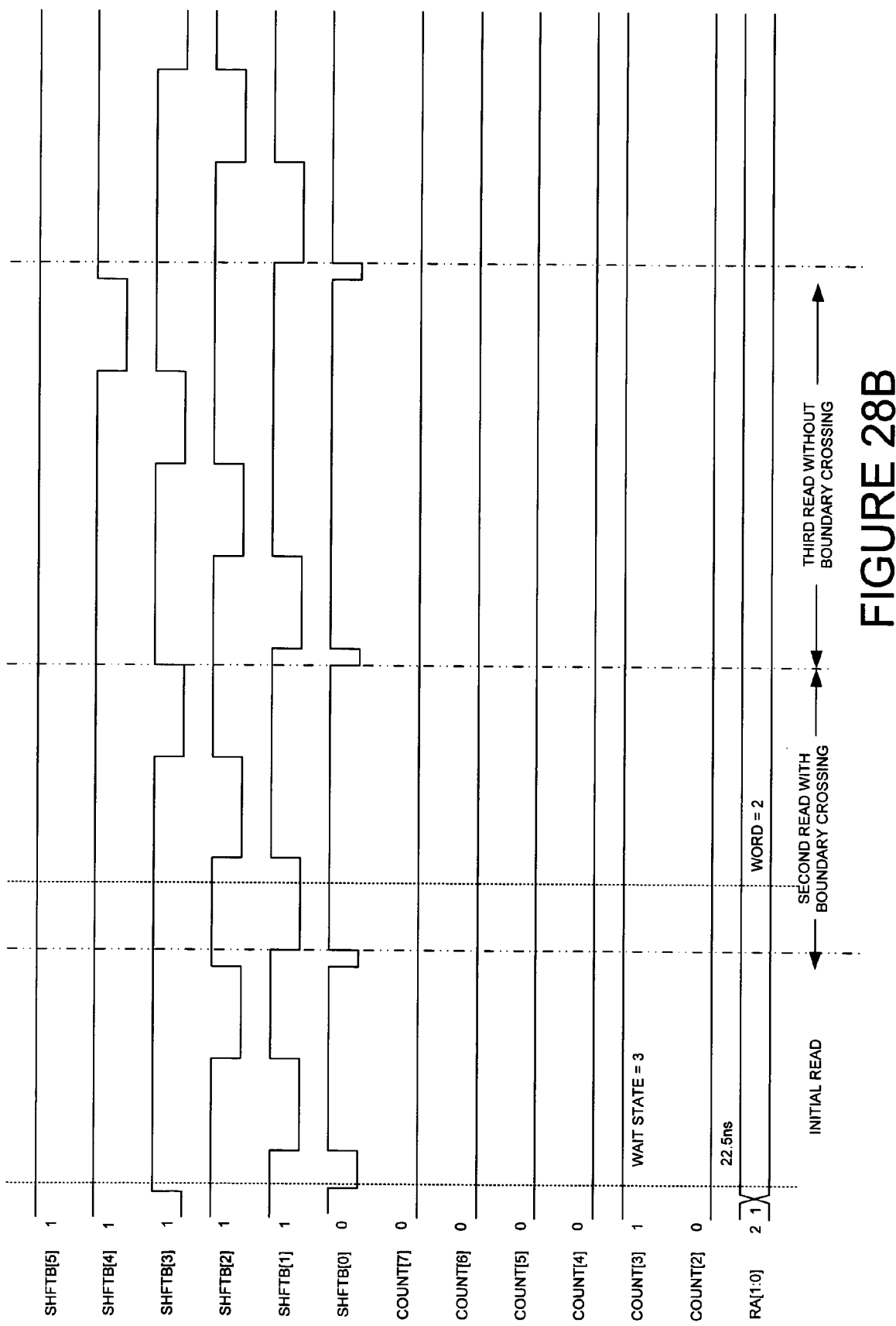
Figure 29A:
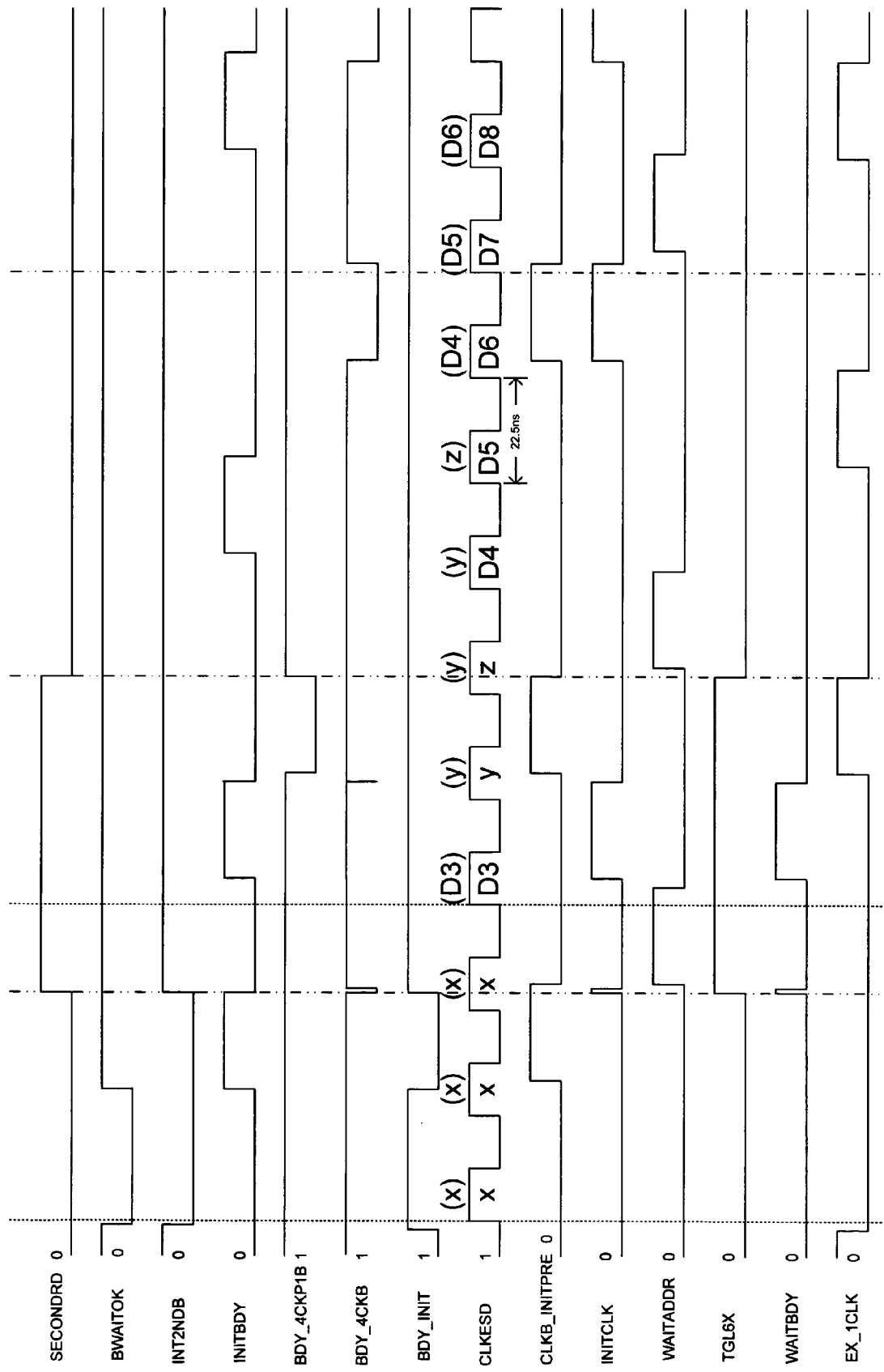
FIGS. 29A and 29B illustrate a comprehensive eighth timing diagram of the circuitry of FIGS. 15–21.
Figure 29B:
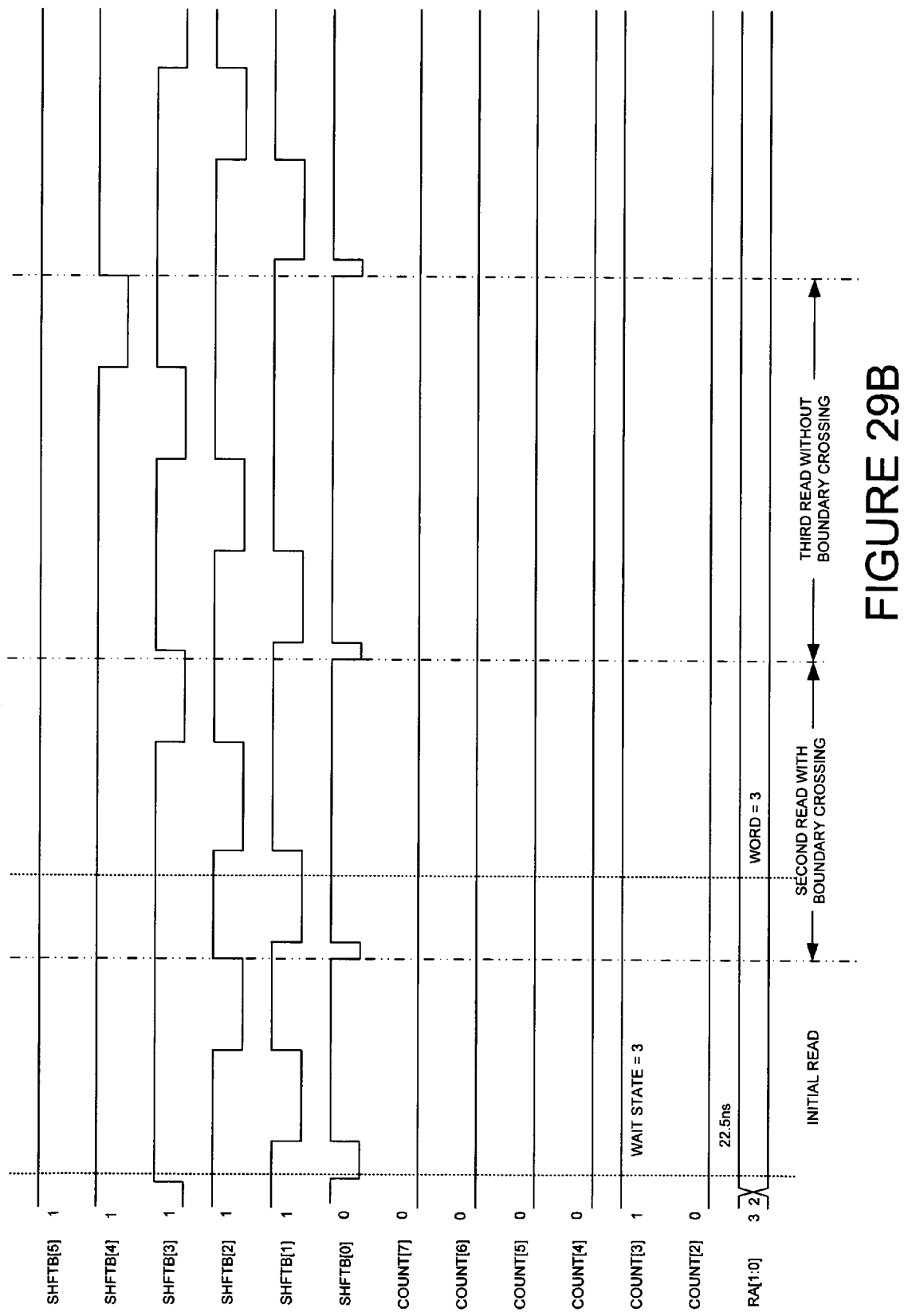

The above cited features are implemented through the circuitry illustrated in FIGS. 15–21, accompanied by examples of illustrative timing diagrams of FIGS. 22 and 23.

The overall circuitry (FIGS. 15–21) is made up of AND gates, NAND gates, OR gates, NOR gates, and inverters connected as shown.

Figure 15:
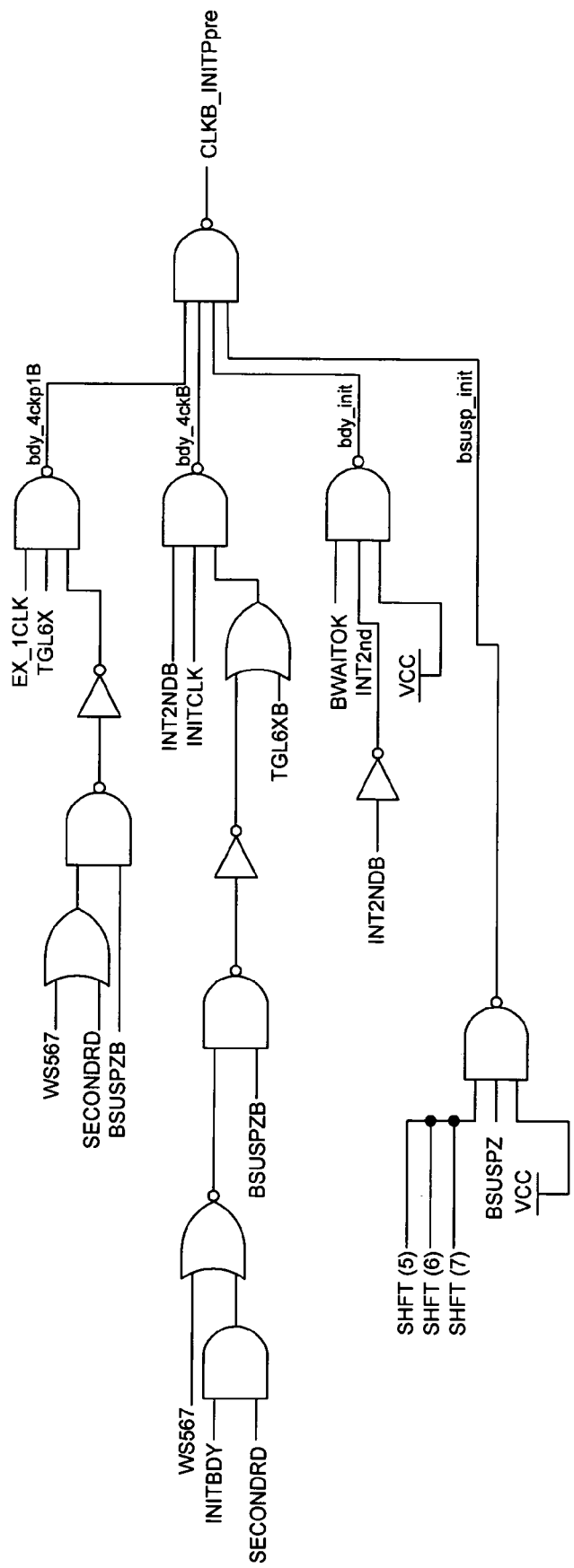
FIGS. 15–21 illustrate implementation of circuitry in accordance with the present invention.

Referring to FIG. 15, CLKB_INITpre is the internal clock signal which allows a new read operation to start. INITCLK and EX_1CLK signals feed into this combinational logic to pulse CLKB_INITpre at the correct time. Previously, INITCLK and EX_1CLK inputs were SHFT(4) and SHFT(5) respectively. SHFT(n) output would determine the total number of words that have been read out. This would always cause CLKB_INITpre to be asserted after 4 data words have been read (or 4 words plus 1 time delays for change of word line condition, which is the worst-case scenario). In accordance with the invention, CLKB_INITpre will be asserted after N words (N=1, 2, 3 or 4) have been read during the second read (SECONDRD=H) which is determined by INITCLK, or 4 words (or 4 words+1 latency) for a subsequent read (SECONDRD=L) which is determined by EX_1CLK (4 words+1 latency is only enabled for operation at 5 or more time delays (x)). At other wait state settings, EX_1CLK will be transparent by having WS567=L block TGL6XB from generating BDY_4CKB. The user sets the proper time delay (x) number based on the external clock frequency.

Figure 16:
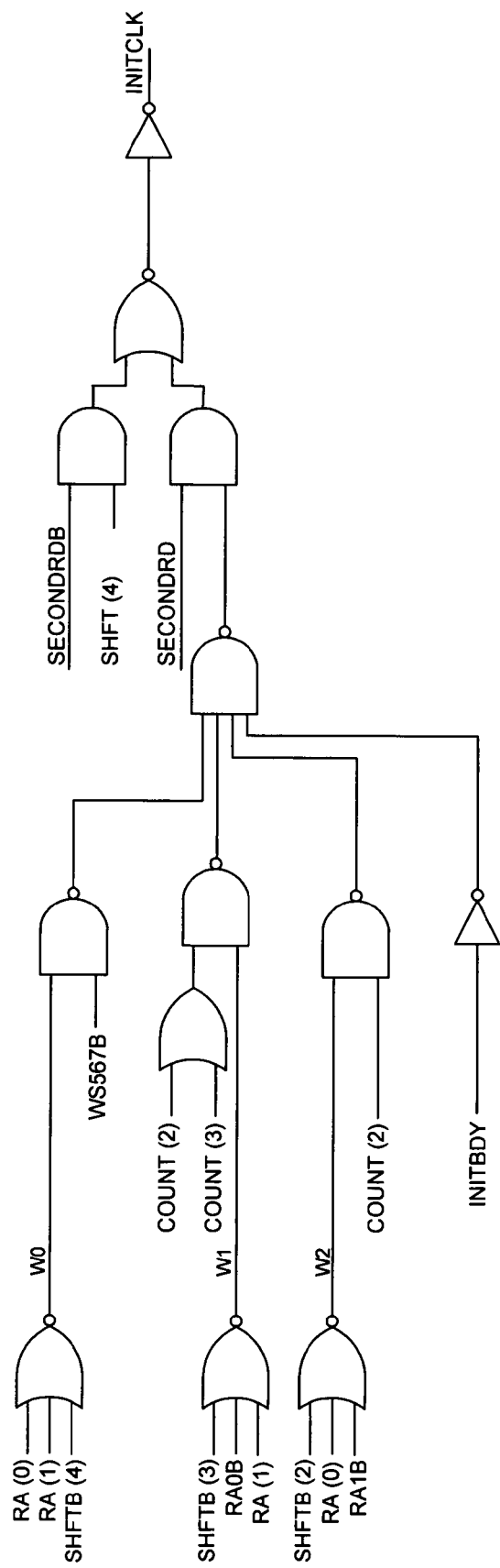

With reference to FIG. 16, INITCLK is used to pulse CLKB_INITpre under certain conditions depending on the initial word address which is decoded by RA[1:0] and the number of time delays(x) set by the user based on the external clock frequency, COUNT (7:2). INITCLK will always be high after N words (N=1, 2, 3 or 4) have been output during the second read (SECONDRD=H) and always after 4 words for subsequent read (SECONDRD=L).

Figure 17:
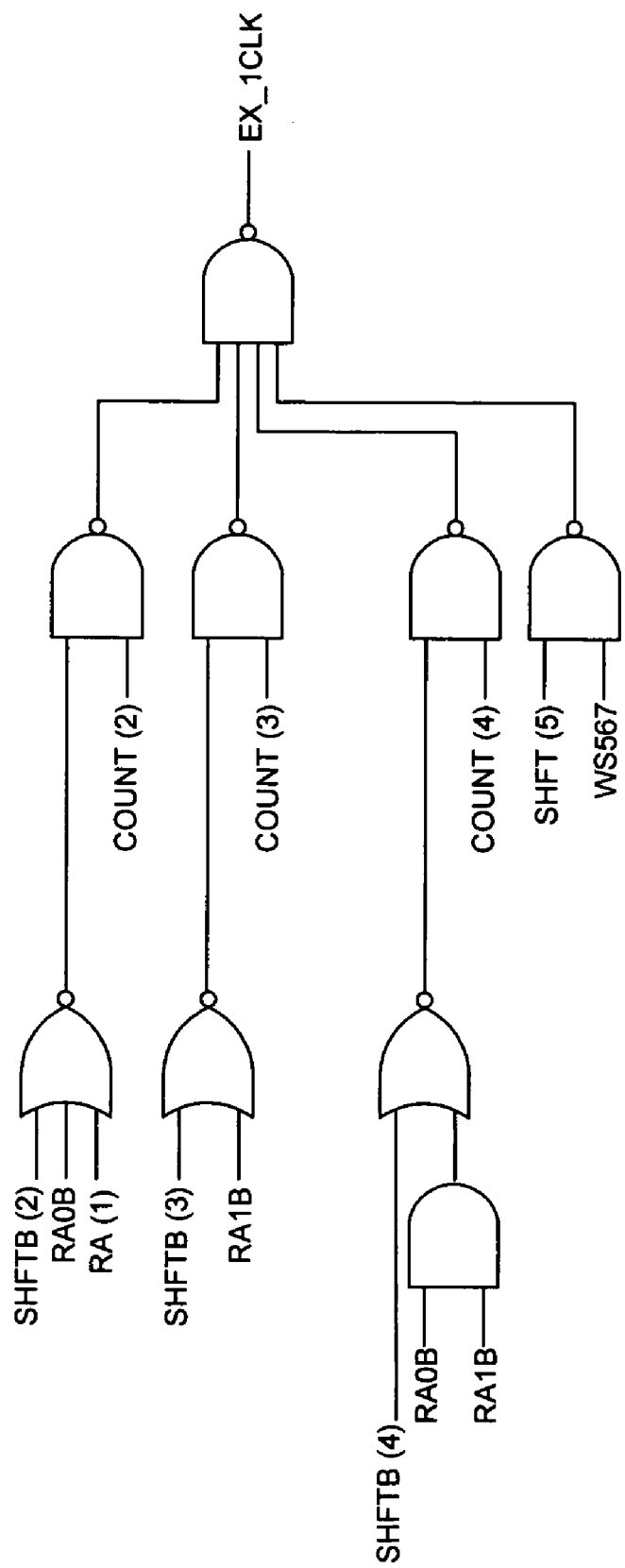

Regarding FIG. 17, EX_1CLK is high to add one extra time delay if word line change occurs. This occurrence will also be based on the initial word address and number of time delays (x).

Figure 18:
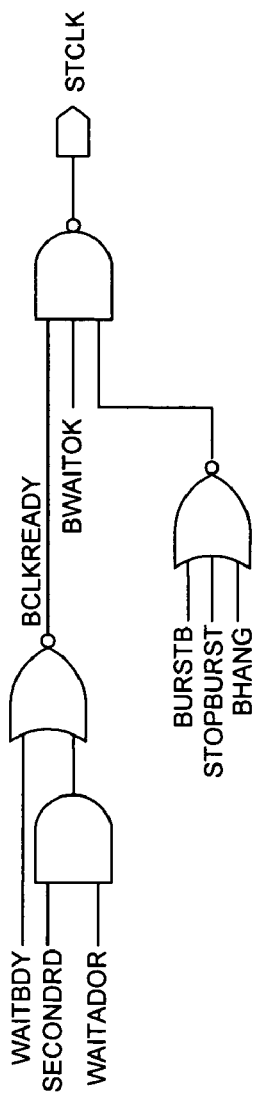

With reference to FIG. 18, STCLK is the internal stop clock signal. This signal is high to stop the data output clock when initial time delays (y) are asserted, which is determined by WAITADDR, or word line change time delay (z), which is determined by WAITBDY. WAITADDR is gated with SECONDRD because initial time delay (y) only occurs during the second read.

Figure 19:
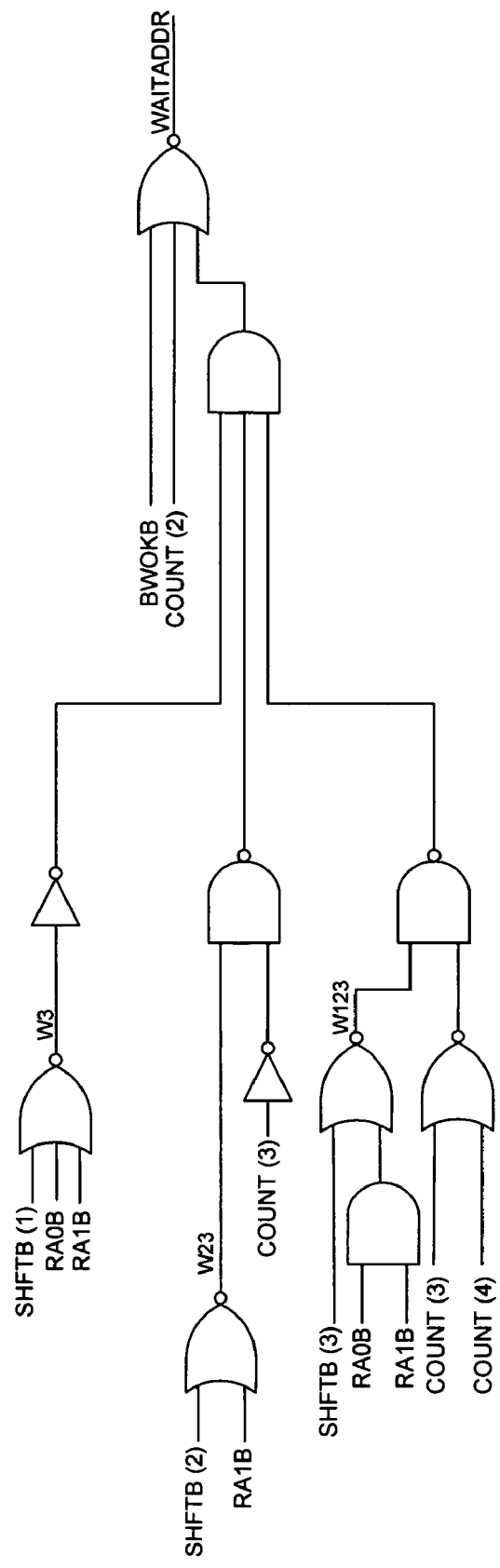

With reference to FIG. 19, WAITADDR determines the initial time delay during the second read. Previously, WAITADDR would be asserted based only on the initial word address. If the initial read address began at word (i) (i=0 to 3), then there would always be a minimum of (i) clock cycle time delays following the output of word 3. This would ensure that there is enough time to read the second set of words before outputting data. In accordance with the invention, WAITADDR is only high when the initial word address starts at (i) word 1, word 2, or word 3 for 5 time delays (x), (ii) word 2 or word 3 for 4 time delays (x), or (iii) word 3 for 3 time delays (x). There is no WAITADDR for 2 time delays because COUNT(2)=H will always force WAITADDR to low. This will optimize the initial wait state latency according to initial word address and time delays (x) chosen. WAITADDR will then cause STCLK to go high to stop the data output clock from outputting data.

Figure 20:
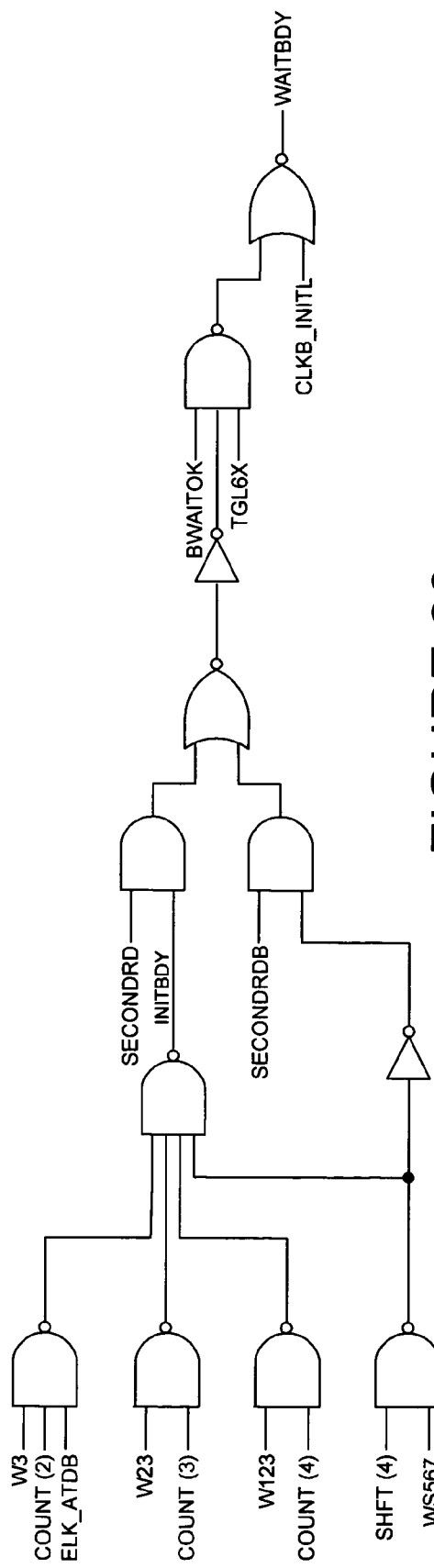

Referring to FIG. 20, WAITBDY high indicates that the read is not finished. One extra time delay is needed to ensure that the subsequent set of words read has enough time to be sensed before outputting data. TGL6X high indicates that reading of the current set of words requires extra time due to the changing of word lines. Previously, WAITBDY would be asserted once the word line change occurs. In accordance with the present invention, WAITBDY will only be asserted under certain conditions based on the initial word address and time delays chosen. If the word line change occurs during the second read (SECONDRD=H), WAITBDY is asserted when the initial word address starts at (i) word 0, word 1, word 2, or word 3 for 5 time delays, (ii) word 1, word 2, or word 3 for 4 time delays, (iii) word 2 or word 3 for 3 time delays, or (iv) word 3 for 2 time delays. If a word line change occurs after the second read (SECONDRD=L), no extra latency is needed unless the device is operated at 5 or more time delays (x). WAITBDY will then cause STCLK to go high to stop the data output clock from outputting data.

Figure 21:

Referring to FIG. 21, WS567 is high if 5, 6 or 7 time delays (x) are chosen.

With reference to FIGS. 22–25 (wherein a change in word line (boundary crossing) occurs after the second read operation), and the circuitry of FIGS. 15–21, the user, based on the clock cycle speed (in this example single clock cycle=22.5 ns), sets COUNT[3] high, thereby selecting 3 time delays (x). In addition, the user selects the initial data word to be output from the buffer (RA[1:0]), in this example, data word D0 for FIG. 22, data word D1 for FIG. 23, data word D2 for FIG. 24, or data word D3 for FIG. 25. In signal SHFTB, clock pulses are counted and reset by signal CLKB_INITpre. The signal SECONDRD differentiates between the second read and subsequent reads, the importance of which is discussed above. The signal TGL6X indicates that the read operation on the current set of words may require additional time due to a boundary crossing, the importance of which is again discussed above. The output of the circuitry of FIG. 19 determines the number of time delays (y) to be added.

Actual time delays are noted in the appropriate FIGS. 22A, 22B, 22C, 22D, positioned under the CLKESD signal, while the time delays of the prior art are noted above the CLKESD signal in parenthesis.

With reference to FIGS. 26–29 (wherein a change in word line (boundary crossing) occurs during the second read operation), and the circuitry of FIGS. 15–21, the user, based on the clock cycle speed (again in this example single clock cycle=22.5 ns), sets COUNT[3] high, thereby selecting 3 time delays (x). In addition, the user selects the initial data word to be output from the buffer (RA[1:0]), in this example, data word D0 for FIG. 26, data word D1 for FIG. 27, data word D2 for FIG. 28, or data word D3 for FIG. 29. In signal SHFTB, clock pulses are counted and reset by signal CLKB_INITpre. The signal SECONDRD differentiates between the second read and subsequent reads. The signal TGL6X indicates that the read operation on the current set of words may require additional time due to a boundary crossing. The output of the circuitry of FIG. 19 determines the number of time delays (y) to be added.

Actual time delays are noted in the appropriate FIGS. 25A, 26A, 27A, 28A, positioned under the CLKESD signal, while the time delays of the prior art are noted above the CLKESD signal in parenthesis.

It will be seen that in the present method only those time delays needed in the specific situation are included, i.e., the minimum number of added output clock cycles needed to ensure proper operation of the memory structure 50. Therefore, the method causes the memory structure 50 to output data in a more rapid and efficient manner than in the prior art.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of reading data in and outputting data from a memory structure comprising:
   undertaking a first read operation to read a first set of data in the memory structure;
   using an output clock, undertaking a first output operation to output data of the first set of data from the memory structure;
   undertaking a second read operation to read a second set of data in the memory structure;
   using the output clock, undertaking a second output operation to output data of the second set of data from the memory structure; and
   in the event that the completion of the first output operation would occur prior to the completion of the second read operation, adding, between the completion of the first output operation and the beginning of the second output operation, the minimum number of output clock cycles needed to insure that the second read operation is completed prior to the initiation of the second output operation.

2. The method of claim 1 wherein the first output operation is initiated after completion of the first read operation.

3. The method of claim 1 wherein the second read operation is undertaken during the first output operation.

4. The method of claim 1 and further comprising a third read operation using an access line of the memory structure which is different from an access line of the memory structure used in the second read operation.

5. The method of claim 1 and further comprising a third read operation using an access line of the memory structure which is the same access line of the memory structure used in the second read operation.

6. The method of claim 1 wherein the memory structure comprises a buffer 54, wherein through each read operation, data is provided to the buffer, and wherein through each output operation, data is provided from the buffer.

7. The method of claim 1 wherein the second read operation uses an access line of the memory structure different from an access line of the memory structure used in the first read operation.

8. The method of claim 1 wherein the second read operation uses an access line of the memory structure which is the same access line of the memory structure used in the first read operation.

9. A method of reading data in and outputting data from a memory structure including a buffer, comprising:
- undertaking a first read operation to read a first set of data in the memory structure and provide data of the first set of data to the buffer;
- using an output clock, undertaking a first output operation providing data read in the first read operation from the buffer;
- undertaking a second read operation to read a second set of data in the memory structure and provide data of the second set of data to the buffer;
- using the output clock, undertaking a second output operation providing data read in the second read operation from the buffer; and
- in the event that the completion of the first output operation would occur prior to the completion of the provision of the data of the second set of data to the buffer, adding, between the completion of the first output operation and the beginning of the second output operation, the minimum number of output clock cycles needed to insure that the provision of the data of the second set of data to the buffer is completed prior to the initiation of the second output operation.

10. The method of claim 9 wherein the first output operation is initiated after completion of the first read operation.

11. The method of claim 10 wherein the second read operation is undertaken during the first output operation.

12. The method of claim 9 and further comprising a third read operation using an access line of the memory structure which is different from an access line of the memory structure used in the second read operation.

13. The method of claim 9 and further comprising a third read operation using an access line of the memory structure which is the same access line of the memory structure used in the second read operation.

14. The method of claim 9 wherein the second read operation uses an access line of the memory structure different from an access line of the memory structure used in the first read operation.

15. The method of claim 9 wherein the second read operation uses an access line of the memory structure which is the same access line of the memory structure used in the first read operation.

* * * * *